(12) United States Patent
Shirai

(10) Patent No.: US 12,519,040 B2
(45) Date of Patent: Jan. 6, 2026

(54) SEMICONDUCTOR DEVICE PACKAGE COMPRISING A PLURALITY OF LEADS WHEREIN A FIRST LEAD HAS A PAD SURFACE LARGER THAN A SECOND LEAD

(71) Applicant: ROHM CO., LTD., Kyoto (JP)

(72) Inventor: Katsutoki Shirai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 807 days.

(21) Appl. No.: 17/697,789

(22) Filed: Mar. 17, 2022

(65) Prior Publication Data
US 2022/0301991 A1  Sep. 22, 2022

(30) Foreign Application Priority Data

Mar. 22, 2021 (JP) ................. 2021-047148

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3107* (2013.01); *H01L 23/49503* (2013.01);
(Continued)

(58) Field of Classification Search
CPC ......... H01L 23/49541; H01L 23/49524; H01L 23/49548; H01L 23/49503
See application file for complete search history.

(56) References Cited

U.S. PATENT DOCUMENTS

2005/0224924 A1* 10/2005 Koh ................. H01L 23/49562
                                                      257/E23.044
2010/0105174 A1*  4/2010 Muto ................... H01L 24/37
                                                      438/123
(Continued)

FOREIGN PATENT DOCUMENTS

JP       2011181549 A    9/2011
JP       2013-239740 A  11/2013
(Continued)

OTHER PUBLICATIONS

Office Action issued in Japanese Application No. 2021047148, mailed Oct. 22, 2024, with machine translation.

*Primary Examiner* — Davienne N Monbleau
*Assistant Examiner* — Dmitri Mihaliov
(74) *Attorney, Agent, or Firm* — HSML P.C.

(57) ABSTRACT

A semiconductor device includes: a semiconductor element having an element main surface and an element back surface spaced apart from each other in a thickness direction and including a plurality of main surface electrodes arranged on the element main surface; a die pad on which the semiconductor element is mounted; a plurality of leads including at least one first lead and at least one second lead and arranged around the die pad when viewed in the thickness direction; a plurality of connecting members including a first connecting member and a second connecting member and configured to electrically connect the plurality of main surface electrodes and the plurality of leads; and a resin member configured to seal the semiconductor element, a part of the die pad, parts of the plurality of leads, and the plurality of connecting members and having a rectangular shape when viewed in the thickness direction.

20 Claims, 22 Drawing Sheets

(52) U.S. Cl.
CPC .... *H01L 24/48* (2013.01); *H01L 2224/48177* (2013.01); *H01L 2224/48472* (2013.01)

(56) References Cited

U.S. PATENT DOCUMENTS

| | | | | |
|---|---|---|---|---|
| 2010/0176499 A1* | 7/2010 | Shibata | ............... | H01L 23/4952 257/676 |
| 2011/0210434 A1* | 9/2011 | Yamashita | ............ | H01L 23/495 257/676 |
| 2011/0298116 A1* | 12/2011 | Mizusaki | ................ | H01L 24/97 257/676 |
| 2013/0140714 A1* | 6/2013 | Numazaki | ............... | H01L 24/97 257/782 |
| 2014/0084434 A1* | 3/2014 | Imura | .................... | H01L 24/49 257/676 |
| 2014/0124912 A1* | 5/2014 | Kaneda | .................. | H01L 24/49 257/676 |
| 2017/0221800 A1* | 8/2017 | Nishikizawa | .......... | H01L 24/83 |
| 2018/0166624 A1* | 6/2018 | Kigoshi | ............... | H10N 52/101 |
| 2020/0312750 A1* | 10/2020 | Shirai | ................. | H01L 23/3114 |

FOREIGN PATENT DOCUMENTS

| | | | | |
|---|---|---|---|---|
| JP | 2015060876 A | | 3/2015 | |
| JP | 2017069584 A | | 4/2017 | |
| JP | 2020009979 A | * | 1/2020 | ............ B25J 9/1697 |

\* cited by examiner

SEMICONDUCTOR DEVICE PACKAGE COMPRISING A PLURALITY OF LEADS WHEREIN A FIRST LEAD HAS A PAD SURFACE LARGER THAN A SECOND LEAD

CROSS-REFERENCE TO RELATED APPLICATION

This application is based upon and claims the benefit of priority from Japanese Patent Application No. 2021-047148, filed on Mar. 22, 2021, the entire contents of which are incorporated herein by reference.

TECHNICAL FIELD

The present disclosure relates to a semiconductor device.

BACKGROUND

There is provided a surface mount type package that enables surface mounting of a semiconductor device on a wiring board to mount the semiconductor device on the wiring board at a high density. As the surface mount type package, for example, a MAP (Mold Array Package) type SON (Small Outlined Non-leaded Package) and a QFN (Quad Flat Non-leaded Package) are known. In the related art, there is known a semiconductor device to which a MAP type QFN is applied. In the related art, the semiconductor device includes a semiconductor chip, a die pad, leads, bonding wires, and a sealing resin. The semiconductor chip is bonded to the die pad. The leads are placed around the die pad. The bonding wires electrically connect the semiconductor chip and the leads. The sealing resin seals the semiconductor chip, the die pad, the leads, and the bonding wires.

A higher performance and a higher quality of a semiconductor device require not only a higher performance and a higher quality of a semiconductor chip, but also modification of a package structure of a semiconductor device.

SUMMARY

Some embodiments of the present disclosure provide a semiconductor device with a higher performance and a higher quality.

According to some embodiments of the present disclosure, there is provided a semiconductor device that includes: a semiconductor element having an element main surface and an element back surface spaced apart from each other in a thickness direction and including a plurality of main surface electrodes arranged on the element main surface; a die pad on which the semiconductor element is mounted; a plurality of leads including at least one first lead and at least one second lead and arranged around the die pad when viewed in the thickness direction; a plurality of connecting members including a first connecting member and a second connecting member and configured to electrically connect the plurality of main surface electrodes and the plurality of leads; and a resin member configured to seal the semiconductor element, a part of the die pad, parts of the plurality of leads, and the plurality of connecting members and having a rectangular shape when viewed in the thickness direction, wherein each of the plurality of leads is configured to entirely overlap with the resin member when viewed in the thickness direction and arranged along an outer edge of the resin member when viewed in the thickness direction, wherein the at least one first lead has a first pad surface to which the first connecting member is bonded, wherein the at least one second lead has a second pad surface to which the second connecting member is bonded, and wherein the first pad surface is larger than the second pad surface when viewed in the thickness direction.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
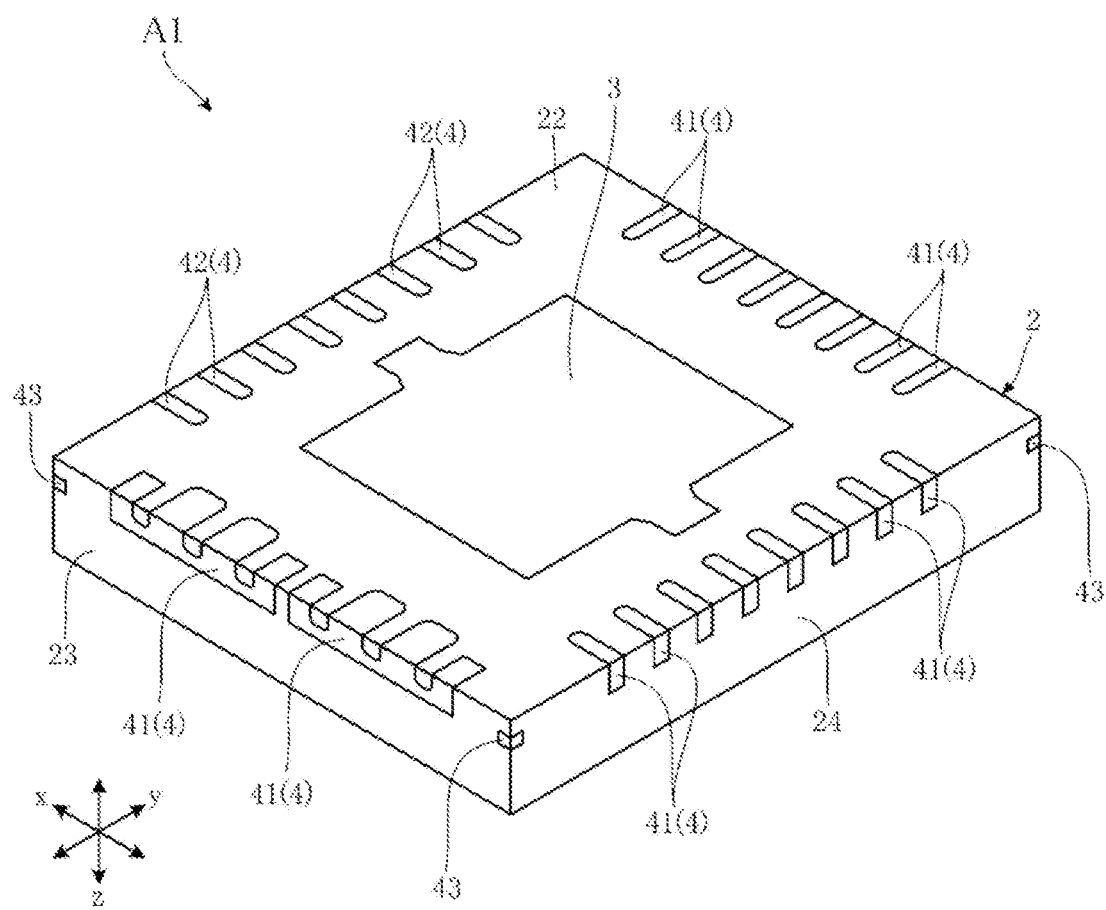
FIG. 1 is a perspective view (back side) showing a semiconductor device according to a first embodiment of the present disclosure.

Embodiments of a semiconductor device of the present disclosure will be described below with reference to the drawings. Hereinafter, the same or similar elements are designated by the same reference numerals and duplicated description thereof will be omitted. The terms such as "first," "second," "third," and the like in the present disclosure are used merely as labels and are not necessarily intended to indicate an order of those objects.

In the present disclosure, "a certain object A being formed in a certain object B" and "a certain object A being formed on a certain object B" include "the certain object A being formed directly in the certain object B" and "the certain object A being formed in the certain object B with another object interposed between the certain object A and the certain object B," unless otherwise specified. Similarly, "a certain object A being arranged in a certain object B" and "a certain object A being arranged on a certain object B" include "the certain object A being arranged directly in the certain object B" and "the certain object A being arranged in the certain object B with another object interposed between the certain object A and the certain object B," unless otherwise specified. Similarly, "a certain object A being positioned on a certain object B" includes "the certain object A being positioned on the certain object B with the certain object A in contact with the certain object B" and "the certain object A being positioned on the certain object B with another object interposed between the certain object A and the certain object B," unless otherwise specified. In addition, "a certain object A overlapping with a certain object B as viewed in a certain direction" includes "the certain object A overlapping with the entirety of the certain object B" and "the certain object A overlapping with a part of the certain object B," unless otherwise specified.

Figure 5:
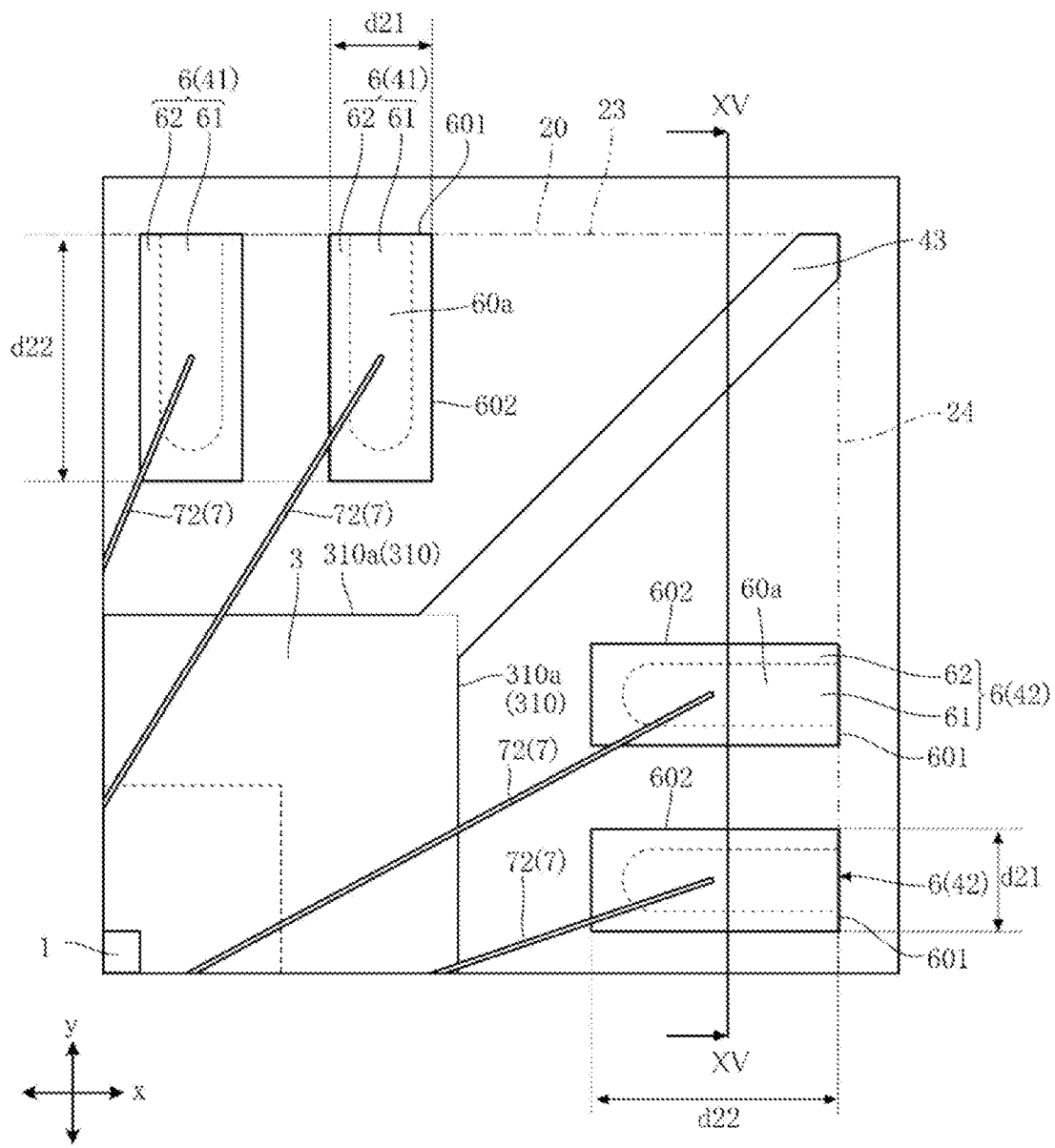
FIG. 5 is an enlarged view of a part (second lead) in FIG. 3.
Figure 6:
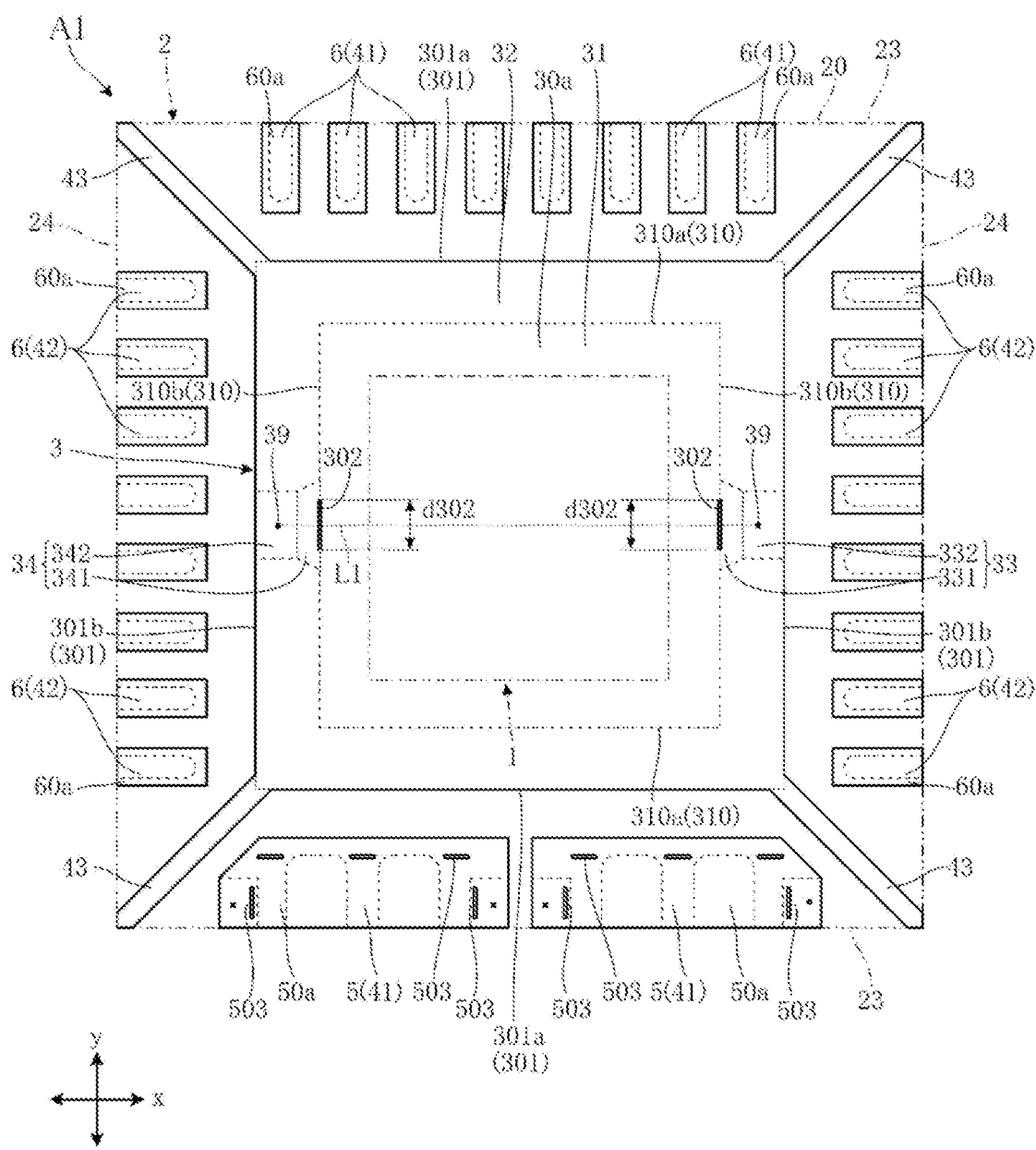
FIG. 6 is a view in which a plurality of connecting members is omitted from the plan view of FIG. 3.

FIGS. 1 to 15 show a semiconductor device A1 according to a first embodiment of the present disclosure. The semiconductor device A1 includes a semiconductor element 1, a resin member 2, a die pad 3, a plurality of leads 4, a plurality of third leads 43, and a plurality of connecting members 7. The plurality of leads 4 includes a plurality of first side leads 41 and a plurality of second side leads 42 and includes a first lead 5 and a second lead 6. The plurality of connecting members 7 includes a plurality of first connecting members 71 and a plurality of second connecting members 72. In FIG. 6, the semiconductor element 1 is indicated by an imaginary line. In FIGS. 3 to 6, the resin member 2 is indicated by an imaginary line.

For convenience of explanation, the thickness direction of each of the semiconductor element 1, the resin member 2, the die pad 3, and the plurality of leads 4 is referred to as "thickness direction z." One side in the thickness directions z may be referred to as an upper side, and the other side may be referred to as a lower side. Further, in the following description, "in a plan view" refers to being viewed along the thickness direction z. The direction orthogonal to the thickness direction z is referred to as "first direction y." The first direction y is the vertical direction in the plan view (see FIGS. 2 and 3) of the semiconductor device A1. The direction orthogonal to the thickness direction z and the first direction y is referred to as "second direction x." The second direction x is the left-right direction in the plan view (see FIGS. 2 and 3) of the semiconductor device A1.

The semiconductor device A1 is a surface mount type package. The package structure of the semiconductor device A1 is, for example, a MAP type QFN. The semiconductor device A1 has a rectangular shape in the plan view. In the semiconductor device A1, the dimension in the first direction y is, for example, 3 mm or more and 12 mm or less, and the dimension in the second direction x is, for example, 3 mm or more and 12 mm or less. Further, in the semiconductor device A1, the dimension in the thickness direction z is, for example, 0.5 mm or more and 1.5 mm or less.

Figure 3:
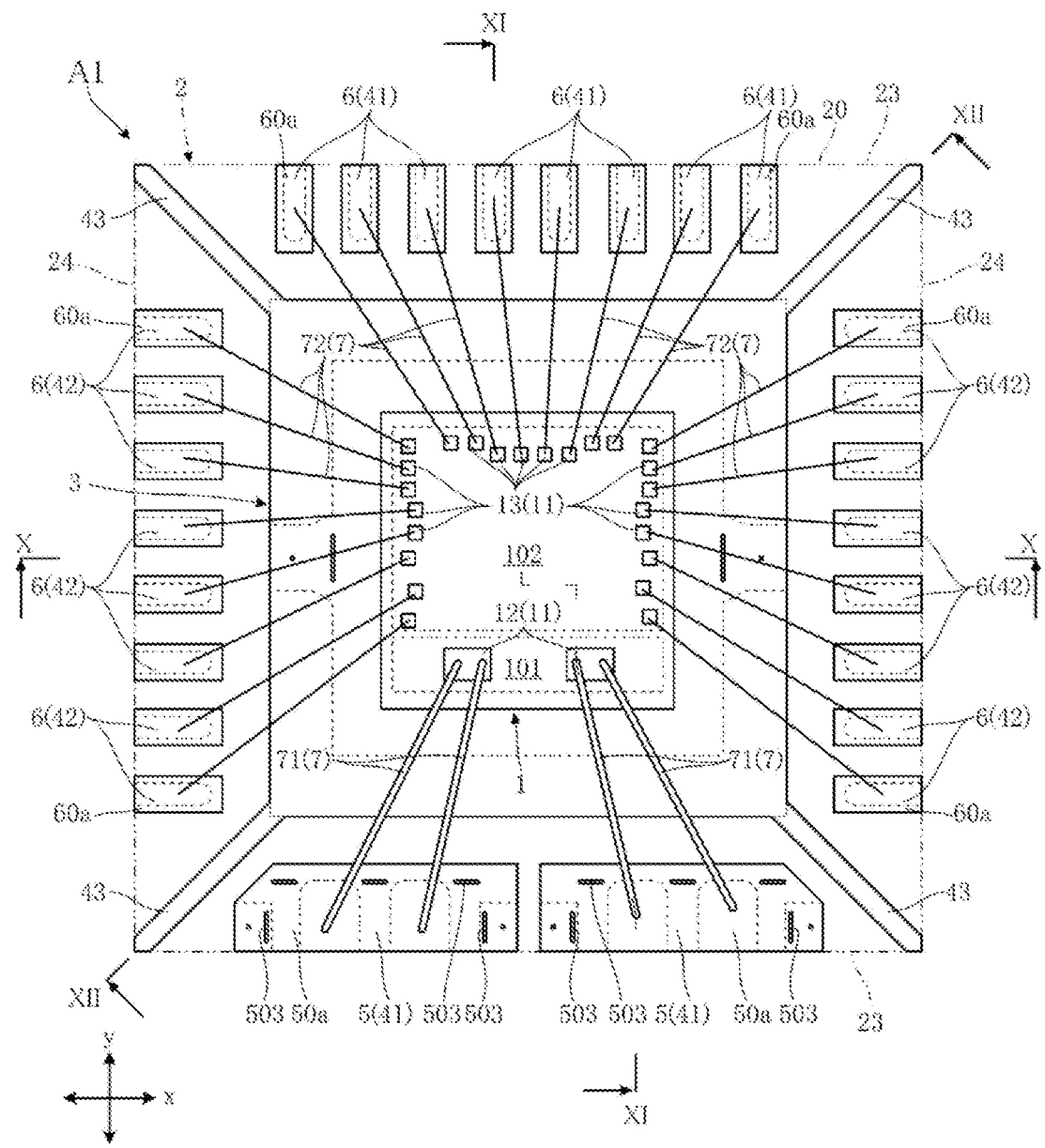
FIG. 3 is a view in which a resin member is made transparent in the plan view of FIG. 2.

The semiconductor element 1 is an element that exerts an electrical function of the semiconductor device A1. The semiconductor element 1 has a rectangular shape in the plan view. The semiconductor element 1 is, for example, an integrated circuit element, but may be an active function element, a passive function element, or the like. In the present embodiment, the semiconductor element 1 is a power IC and includes a power component 101 and a control circuit component 102 as shown in FIG. 3. The power component 101 includes a power element such as a transistor or the like. The control circuit component 102 is a control circuit configured to control the power element of the power component 101. In the example shown in FIG. 3, in the plan view, the power component 101 is arranged on one side (a lower side in FIG. 3) of the control circuit component 102 in the first direction y. The semiconductor element 1 is not limited to a configuration including the power component 101 and the control circuit component 102 and may include only one of the power component 101 and the control circuit component 102.

Figure 10:
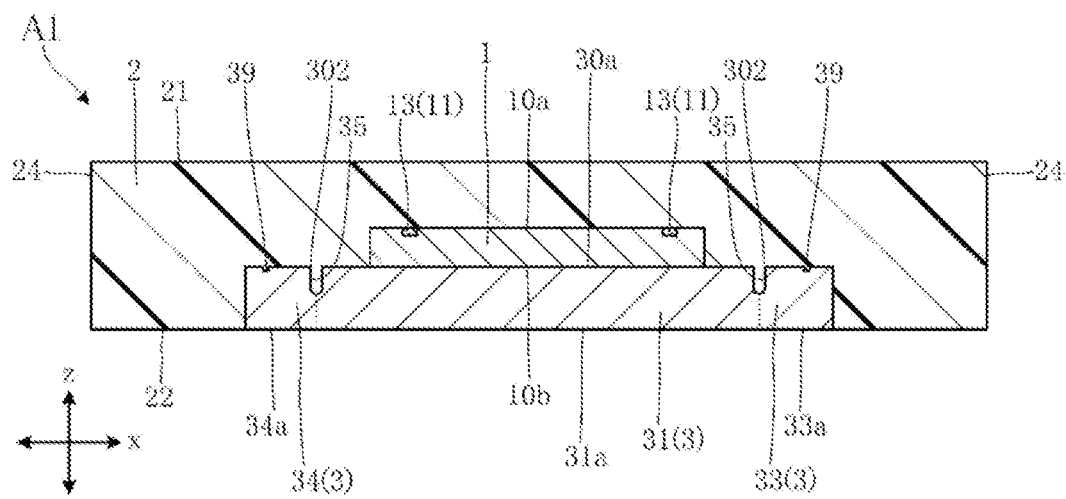
FIG. 10 is a cross-sectional view taken along line X-X in FIG. 3.
Figure 11:
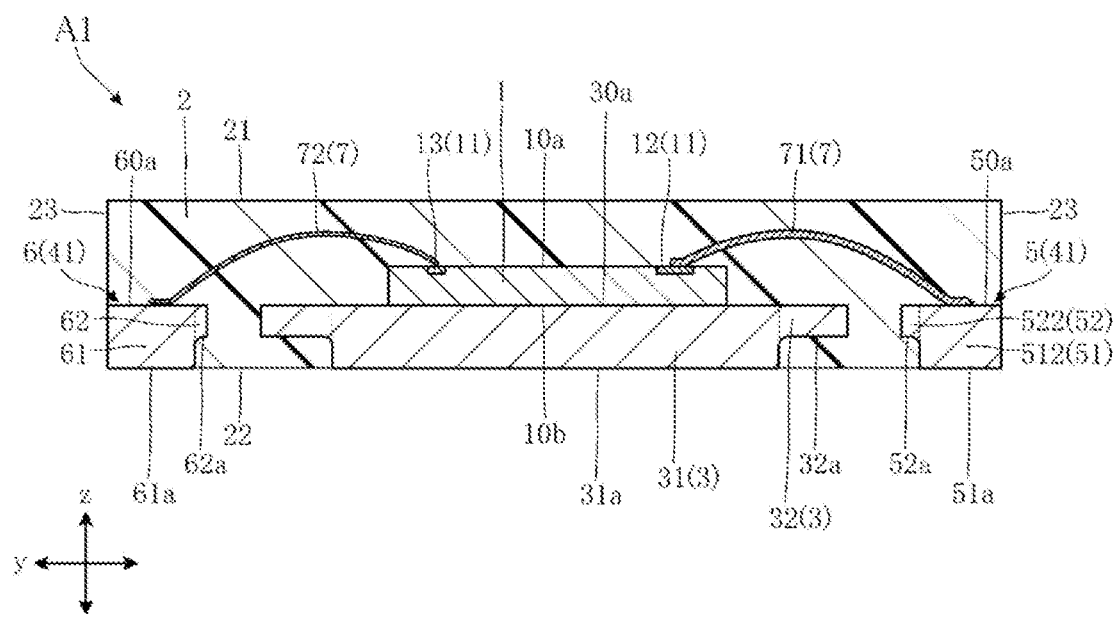
FIG. 11 is a cross-sectional view taken along line XI-XI in FIG. 3.
Figure 12:
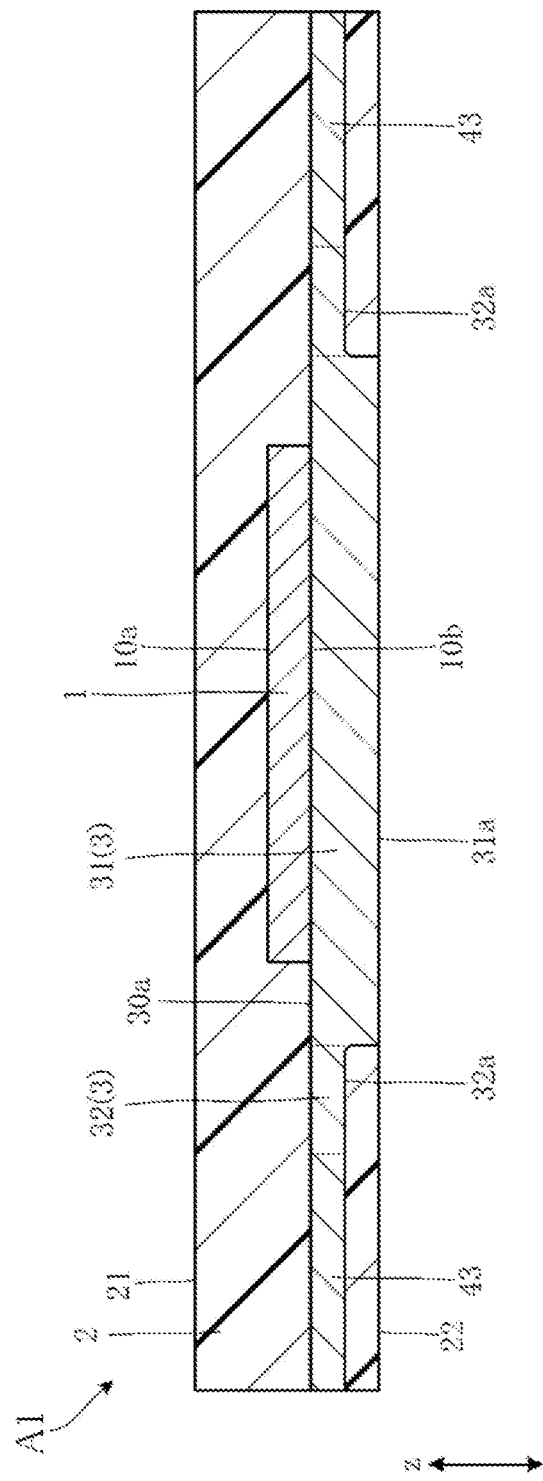
FIG. 12 is a cross-sectional view taken along line XII-XII in FIG. 3.

As shown in FIGS. 10 to 12, the semiconductor element 1 has an element main surface 10a and an element back surface 10b. The element main surface 10a and the element back surface 10b are spaced apart from each other in the thickness direction z and face opposite sides. The element main surface 10a faces the upper side in the thickness direction z, and the element back surface 10b faces the lower side in the thickness direction z.

As shown in FIGS. 10 and 11, the semiconductor element 1 includes a plurality of main surface electrodes 11 arranged on the element main surface 10a. As shown in FIG. 3, the plurality of main surface electrodes 11 includes a plurality of first main surface electrodes 12 and a plurality of second main surface electrodes 13. Each of the plurality of first main surface electrodes 12 is electrically connected to the power component 101. Each of the plurality of second main surface electrodes 13 is electrically connected to the control circuit component 102. The number, arrangement, shape and plan-view dimensions of the plurality of main surface electrodes 11 (the plurality of first main surface electrodes 12 and the plurality of second main surface electrodes 13) are not limited to the examples shown in FIG. 3 and may be changed appropriately according to the semiconductor element 1 used.

The semiconductor element 1 is bonded to the die pad 3 by, for example, a bonding material (not shown). The bonding material may be insulating or conductive. However, when the electrodes are arranged on the element back surface 10b of the semiconductor element 1, the semiconductor element 1 is bonded to the die pad 3 by a conductive bonding material, such that the electrodes arranged on the element back surface 10b are electrically connected to the die pad 3 via the conductive bonding material.

The resin member 2 is a sealing material that protects the semiconductor element 1. The resin member 2 is made of an insulating resin material. The resin material is, for example, a black epoxy resin. The resin member 2 covers, for example, the semiconductor element 1, a part of the die pad 3, parts of a plurality of leads 4, parts of the plurality of third leads 43, and the plurality of connecting members 7. The resin member 2 has a rectangular shape in the plan view. The resin member 2 has a resin main surface 21, a resin back surface 22, a pair of first resin side surfaces 23, and a pair of second resin side surfaces 24.

As shown in FIGS. 8 to 12, the resin main surface 21 and the resin back surface 22 are spaced apart from each other in the thickness direction z and face opposite sides. The resin main surface 21 faces the upper side in the thickness direction z, and the resin back surface 22 faces the lower side in the thickness direction z.

Figure 2:
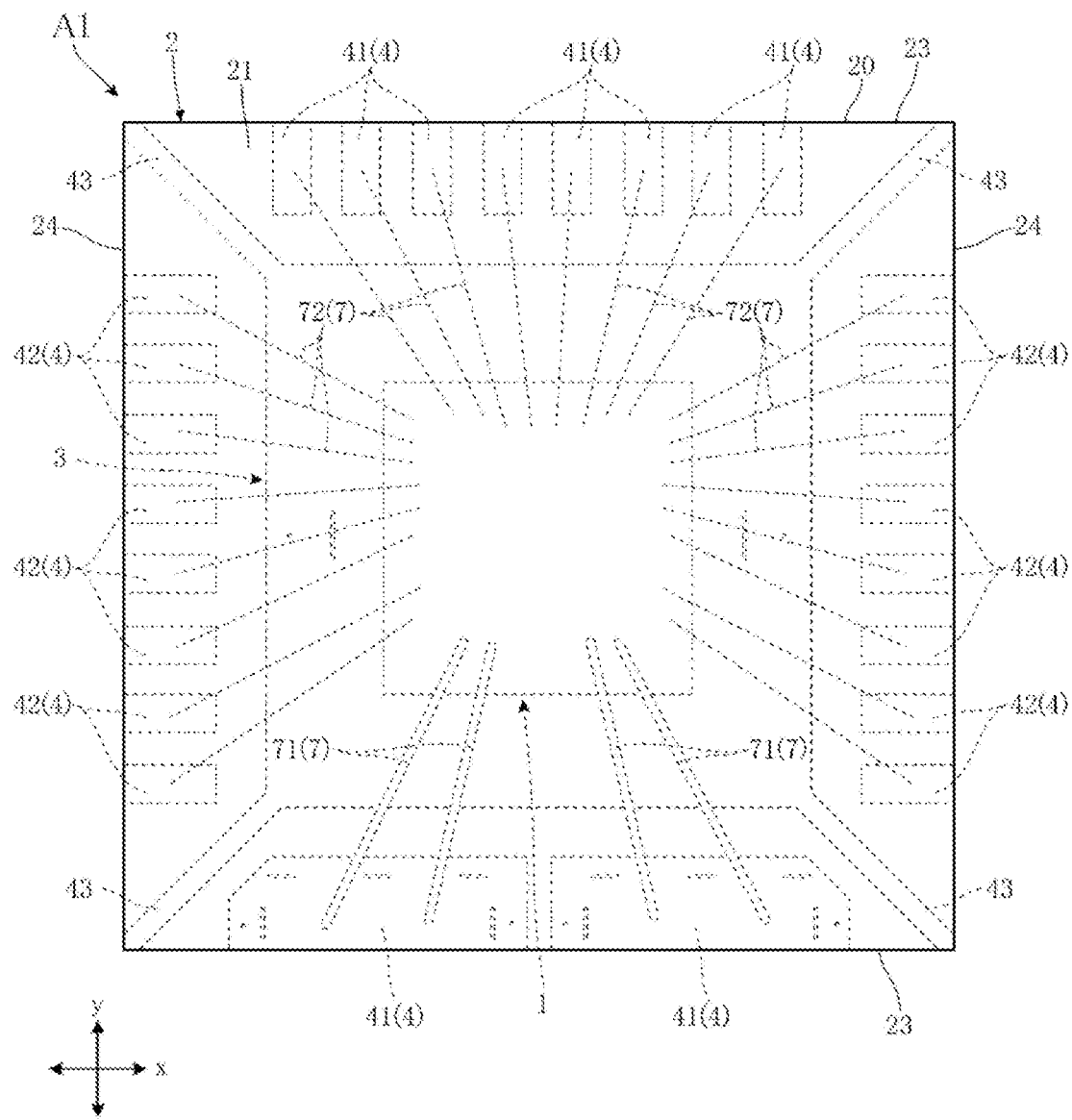
FIG. 2 is a plan view showing a semiconductor device according to the first embodiment of the present disclosure.

The pair of first resin side surfaces 23 and the pair of second resin side surfaces 24 are connected to both the resin main surface 21 and the resin back surface 22, respectively, and are interposed between the resin main surface 21 and the resin back surface 22 in the thickness direction z. The pair of first resin side surfaces 23 and the pair of second resin side surfaces 24 respectively extend upward from the resin back surface 22 and stand upright in the illustrated example. The pair of first resin side surfaces 23 are spaced apart from each other in the first direction y and are arranged substantially in parallel. The pair of first resin side surfaces 23 face opposite sides. The pair of second resin side surfaces 24 are spaced apart from each other in the second direction x and are arranged substantially in parallel. The pair of second resin side surfaces 24 face opposite sides. As shown in FIGS. 2 and 3, an outer edge 20 of the resin member 2 in the plan view overlaps with the pair of first resin side surfaces 23 and the pair of second resin side surfaces 24.

The semiconductor element 1 is mounted on the die pad 3. The die pad 3 has a rectangular shape in the plan view. The die pad 3 is located at the center of the semiconductor device A1 in the plan view. The die pad 3 is made of, for example, copper or a copper alloy.

As shown in FIGS. 10 to 12, the die pad 3 has a die pad main surface 30a. Further, the die pad 3 includes a first portion 31, a second portion 32, a third portion 33, and a fourth portion 34, as shown in FIGS. 6, 7, and 10 to 12.

As shown in FIGS. 10 to 12, the die pad main surface 30a faces one side (upper side) in the thickness direction z. That is, the die pad main surface 30a faces the same side as the element main surface 10a. The semiconductor element 1 is mounted on the die pad main surface 30a, which faces the element back surface 10b. As can be seen from FIGS. 6 and 10 to 12, the die pad main surface 30a spans the first portion 31, the second portion 32, the third portion 33, and the fourth portion 34. The die pad main surface 30a includes an upper surface of the first portion 31, an upper surface of the second portion 32, an upper surface of the third portion 33, and an upper surface of the fourth portion 34. In the die pad main surface 30a, for example, a process of plating a Ni layer and an Ag layer in the named order is performed on a base. However, this plating process may not be performed, or may be performed with other conductive materials.

Figure 7:
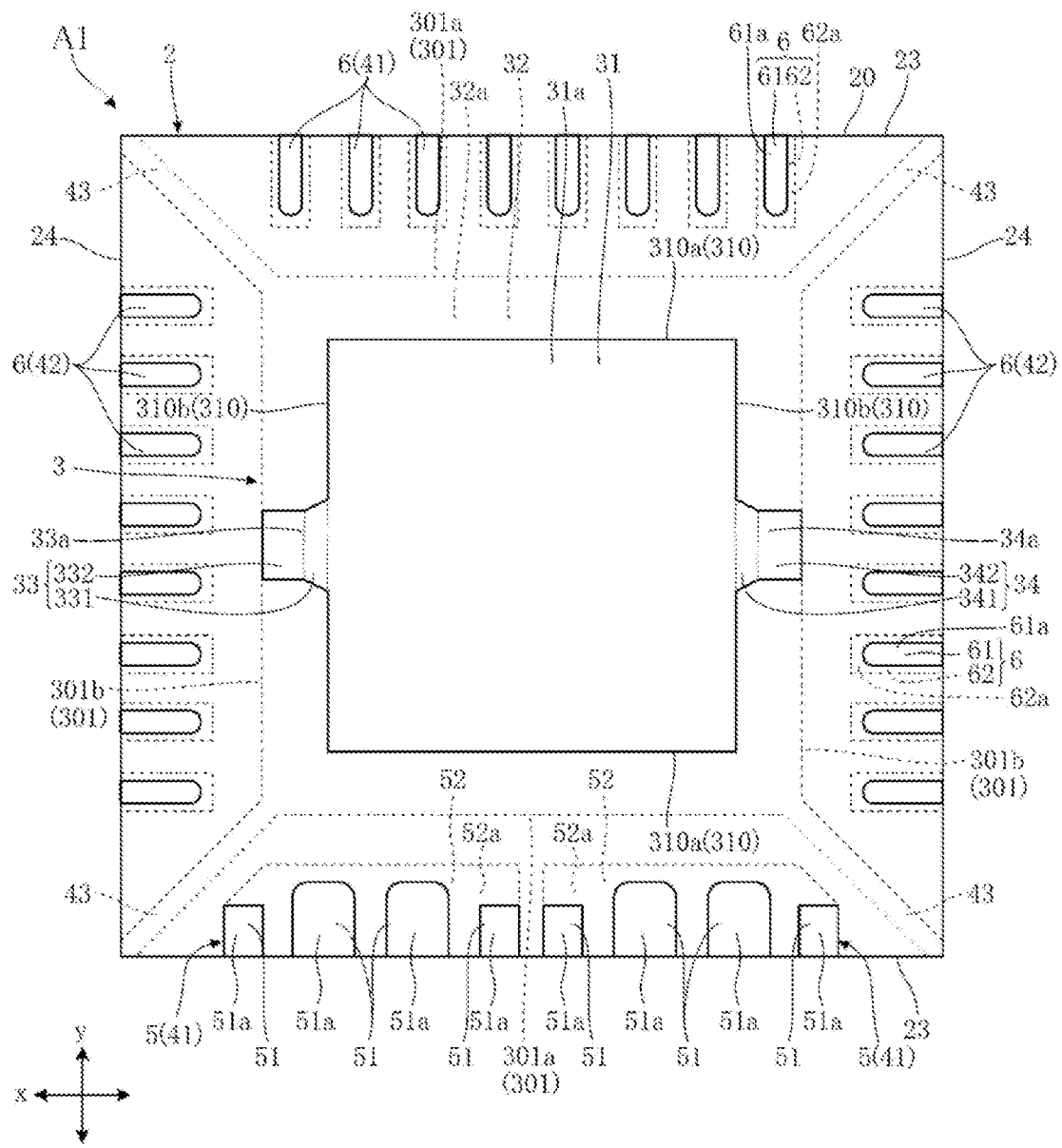
FIG. 7 is a bottom view showing the semiconductor device according to the first embodiment of the present disclosure.
Figure 8:
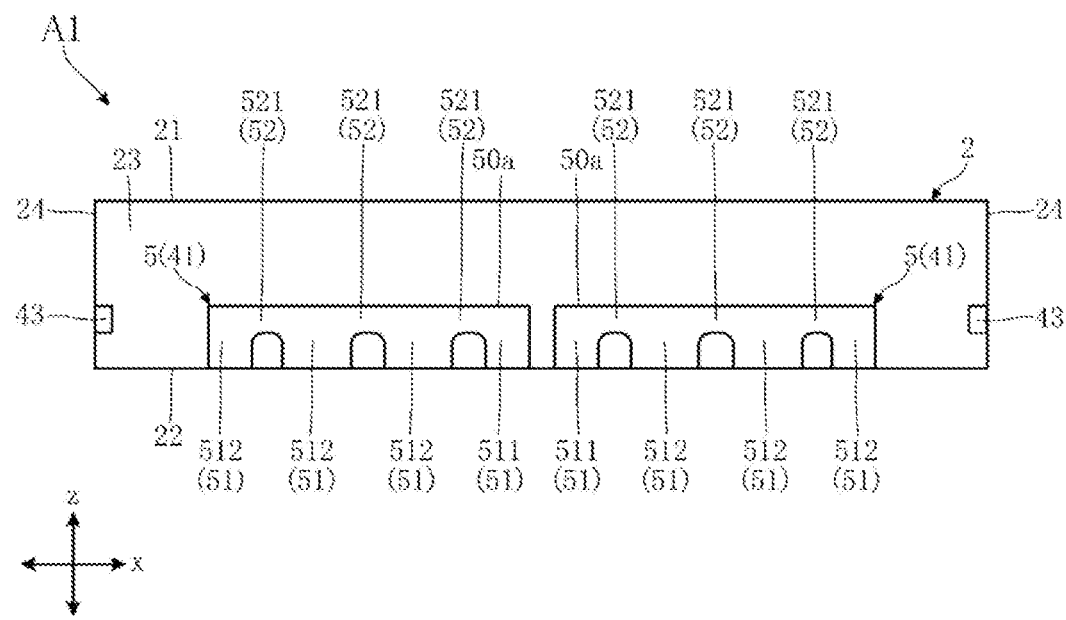
FIG. 8 is a front view showing a semiconductor device according to the first embodiment of the present disclosure.
Figure 9:
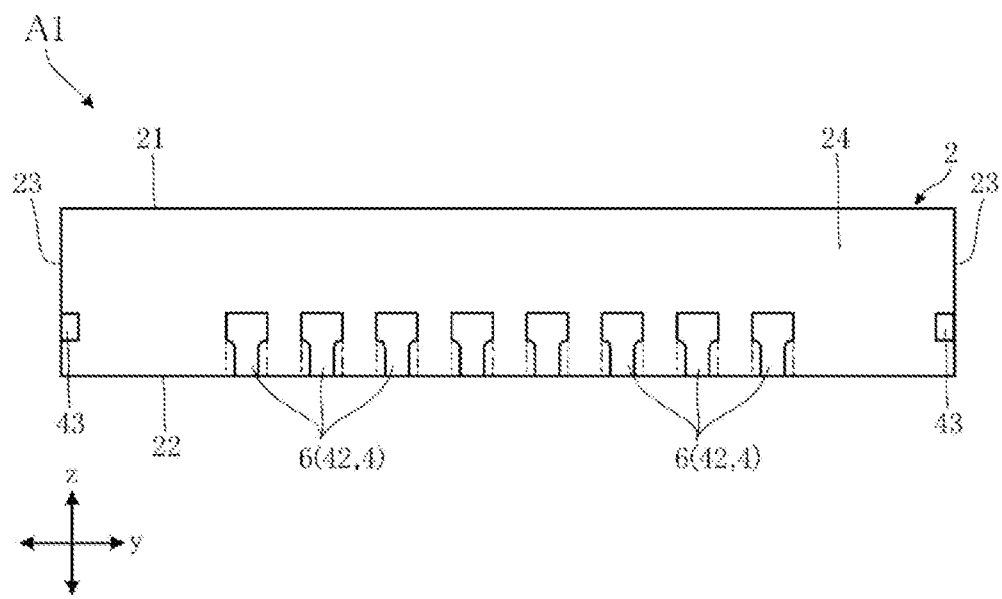
FIG. 9 is a side view (right side view) showing a semiconductor device according to the first embodiment of the present disclosure.

As shown in FIGS. 6 and 7, the outer edge 301 of the die pad main surface 30a in the plan view has a pair of end edges 301a and a pair of end edges 301b. The pair of end edges 301a are spaced apart from each other in the first direction y and are substantially parallel to each other. Each of the pair of end edges 301a extends in the second direction x. The pair of end edges 301b are spaced apart from each other in the second direction x and are substantially parallel to each other. Each of the pair of end edges 301b extends in the first direction y.

As shown in FIGS. 6 and 10, the die pad main surface 30a includes a pair of openings 302. One of the pair of openings 302 (the opening 302 on one side in the second direction x) is formed, for example, to overlap with a boundary between the first portion 31 and the third portion 33 in the plan view. The opening 302 may not be formed to overlap with the boundary between the first portion 31 and the third portion 33, but may be out of alignment from this boundary to the side of the first portion 31 or the side of the third portion 33 in the second direction x. The other side of the pair of openings 302 (the opening 302 on the other side in the second direction x) is formed, for example, to overlap with a boundary between the first portion 31 and the fourth portion 34 in the plan view. The opening 302 may not be formed to overlap with a boundary between the first portion 31 and the fourth portion 34, but may be out of alignment from this boundary to the side of the first portion 31 or the side of the fourth portion 34 in the second direction x. In the example shown in FIG. 6 and the like, each opening 302 is formed in a linear shape extending in the first direction y in the plan view. Unlike this example, a plurality of dot-shaped openings 302 may be arranged along the first direction y at each of the boundary between the first portion 31 and the third portion 33 and the boundary between the first portion 31 and the fourth portion 34.

The first portion 31 is a portion where the semiconductor element 1 is mounted. As shown in FIGS. 3 and 6, the first portion 31 overlaps with the semiconductor element 1 in the plan view. The first portion 31 has a rectangular shape in the plan view. The first portion 31 is located at the center of the die pad 3 in the plan view. The first portion 31 has a back surface 31a in the plan view, as shown in FIGS. 7 and 10 to 12. The back surface 31a faces the side opposite to the die pad main surface 30a in the thickness direction z. As shown in FIGS. 10 to 12, the back surface 31a is flush with the resin back surface 22 and is exposed from the resin member 2 (resin back surface 22). The first portion 31 has a rectangular shape in the plan view. The dimension of the first portion 31 in the thickness direction z, i.e., a distance from the die pad main surface 30a to the back surface 31a along the thickness direction z is, for example, 0.15 mm or more and 0.25 mm or less.

As shown in FIGS. 6 and 7, an outer edge 310 of the first portion 31 in the plan view includes a pair of end edges 310a and a pair of end edges 310b. The pair of end edges 310a are spaced apart from each other in the first direction y and are substantially parallel to each other. Each of the pair of end edges 310a extends in the second direction x. The pair of end edges 310a are parallel to the pair of end edges 301a (die pad main surface 30a). The pair of end edges 310b are spaced apart from each other in the second direction x and are substantially parallel to each other. Each of the pair of end edges 310b extends in the first direction y. The pair of end edges 310b are parallel to the pair of end edges 301b (die pad main surface 30a).

As shown in FIGS. 6 and 7, the second portion 32 is arranged around the first portion 31 in the plan view and is connected to the outer edge 310 of the first portion 31. As shown in FIGS. 11 and 12, the second portion 32 has a back surface 32a. The back surface 32a faces the side opposite to the die pad main surface 30a. As shown in FIGS. 11 and 12, the back surface 32a is located closer to the die pad main surface 30a than the back surface 31a in the thickness direction z. Further, the back surface 32a is covered with the resin member 2. Since the back surface 32a of the second portion 32 is covered with the resin member 2, the die pad 3 is suppressed from being removed from the resin member 2. The second portion 32 is a portion thinned from the other side (lower side) of the die pad 3 in the thickness direction z. This thinning is performed by, for example, etching (half etching), but may be performed by press working. The thickness (dimension in the thickness direction z) of the second portion 32 is, for example, about half of the thickness (dimension in the thickness direction z) of the first portion 31. The dimension of the second portion 32 in the thickness direction z, i.e., a distance from the die pad main surface 30a to the back surface 32a along the thickness direction z is, for example, 0.075 mm or more and 0.125 mm or less.

As shown in FIGS. 6 and 7, each of the third portion 33 and the fourth portion 34 is arranged around the first portion 31 in the plan view and extends from the outer edge 310 of the first portion 31. The third portion 33 and the fourth portion 34 are arranged around the first portion 31 such that, for example, as shown in FIG. 6, a line segment L1 connecting the center of the third portion 33 in the plan view and the center of the fourth portion 34 in the plan view overlaps with the semiconductor element 1. The line segment L1 may overlap with the center of the semiconductor element 1 in the plan view.

The third portion 33 extends from one of the pair of end edges 310b of the first portion 31 and extends to one of the pair of end edges 301b of the die pad main surface 30a. In the illustrated example, the third portion 33 is connected to the central portion of one of the pair of end edges 310b in the first direction y. As shown in FIG. 10, the third portion 33 has a back surface 33a. The back surface 33a faces the side opposite to the die pad main surface 30a. As shown in FIG. 10, the back surface 33a is flush with the back surface 31a in the thickness direction z. Further, the back surface 33a is flush with the resin back surface 22 and is exposed from the resin member 2 (resin back surface 22). The dimension of the third portion 33 in the thickness direction z, i.e., the distance from the die pad main surface 30a to the back surface 33a along the thickness direction z, is the same as the dimension of the first portion 31 in the thickness direction z.

The fourth portion 34 extends from the other of the pair of end edges 310b of the first portion 31 and extends to the other of the pair of end edges 301b of the die pad main surface 30a. In the illustrated example, the fourth portion 34 is connected to the central portion of the other of the pair of end edges 310b in the first direction y. As shown in FIG. 10, the fourth portion 34 has a back surface 34a. The back surface 34a faces the side opposite to the die pad main surface 30a. As shown in FIG. 10, the back surface 34a is flush with the back surface 31a in the thickness direction z. Further, the back surface 34a is flush with the resin back surface 22 and is exposed from the resin member 2 (resin back surface 22). The dimension of the fourth portion 34 in the thickness direction z, i.e., the distance from the die pad main surface 30a to the back surface 34a along the thickness direction z, is the same as the dimension of the first portion 31 in the thickness direction z and the thickness of the third portion 33 in the thickness direction z.

As shown in FIGS. 6 and 7, the third portion 33 includes a tapered portion 331 and a band-shaped portion 332, and the fourth portion 34 includes a tapered portion 341 and a band-shaped portion 342. The tapered portions 331 and 341 are connected to the outer edge 310 (the pair of end edges 310b) of the first portion 31. The band-shaped portions 332 and 342 extend from the tapered portions 331 and 341 to the outer edge 301 (the pair of end edges 301b) of the die pad main surface 30a. The band-shaped portions 332 and 342 have, for example, a rectangular shape in the plan view. In the example in which the third portion 33 and the fourth portion 34 extend from the pair of end edges 310b in the plan view, both ends of each opening 302 in the first direction y overlap with the band-shaped portions 332 and 342 when viewed in the second direction x. A length d302 (see FIG. 6) of each opening 302 in the plan view is, for example, 0.3 mm or more and 4.0 mm or less. The length d302 is the dimension of each opening 302 in the direction (first direction y) in which the pair of end edges 310a extends. The length d302 is, for example, equal to or less than the width of each of the band-shaped portions 332 and 342 (the dimension of each of the band-shaped portions 332 and 342 in the direction in which the pair of end edges 310a extends). The width of the tapered portions 331 and 341 becomes narrower in the plan view from the pair of end edges 310a toward the band-shaped portions 332 and 342. The width in the semiconductor device A1 is the dimension along the first direction y. Unlike the example shown in FIGS. 6 and 7, the third portion 33 may not include the tapered portion 331 and may include the band-shaped portion 332. In this case, in the plan view, the band-shaped portion 332 extends from the outer edge 310 (one of the pair of end edges 310b) of the first portion 31 to the outer edge 301 (one of the pair of end edges 301b) of the die pad main surface 30a. Similarly, the fourth portion 34 may include the band-shaped portion 342 without including the tapered portion 341. In this case, in the plan view, the band-shaped portion 342 extends from the outer edge 310 of the first portion 31 (the other of the pair of end edges 310b) to the outer edge 301 of the die pad main surface 30a (the other of the pair of end edges 301b).

The die pad 3 includes a plurality of recesses 35. As shown in FIG. 10, each recess 35 is recessed from the die pad main surface 30a in the thickness direction z. As shown in FIG. 10, each recess 35 includes any of a pair of openings 302 and extends from any of the pair of openings 302 to the other (lower) side in the thickness direction z. The plurality of recesses 35 and the pair of openings 302 are respectively formed by, for example, etching. These may be formed by press working called stamping or may be formed by laser machining, instead of etching. For example, when formed by stamping, each recess 35 may be a V-shaped recess instead of the U-shaped recess shown in FIG. 10.

The die pad 3 is formed with a pair of clamp marks 39. Each of the pair of clamp marks 39 is recessed in the thickness direction z from the die pad main surface 30a. Each clamp mark 39 is a pressing mark formed by a clamp member described later and exhibits a scratch-like shape slightly recessed from the die pad main surface 30a. One pair of clamp marks 39 is formed on each of the third portion 33 and the fourth portion 34. For example, the pair of clamp marks 39 are formed at the center of the third portion 33 in the plan view and the center of the fourth portion 34 in the plan view, respectively. The clamp marks 39 may not be formed on the die pad 3.

As shown in FIGS. 1 and 2, each of the plurality of leads 4 entirely overlaps with the resin member 2 when viewed in the thickness direction z. As shown in FIG. 2, the plurality of leads 4 are arranged along the outer edge 20 of the resin member 2 when viewed in the thickness direction z. As shown in FIG. 1, each of the plurality of leads 4 is exposed from the resin back surface 22. Each of the plurality of leads 4 is made of, for example, copper or a copper alloy. The die pad 3 and the plurality of leads 4 are formed from, for example, one lead frame. In the semiconductor device A1, the plurality of leads 4 include a plurality of first side leads 41 and a plurality of second side leads 42, as shown in FIGS. 1 and 2.

As shown in FIGS. 1 to 3, 6, and 7, the plurality of first side leads 41 are arranged to sandwich the die pad 3 in the first direction y. The plurality of first side leads 41 include first side leads arranged on one side (the upper side in FIGS. 2 and 3) in the first direction y with respect to the die pad 3 and first side leads arranged on the other side (the lower side in FIGS. 2 and 3) in the first direction y with respect to the die pad 3. The plurality of first side leads 41 are arranged along the second direction x on both sides of the die pad 3 in the first direction y. Each of the plurality of first side leads 41 is exposed from any of the pair of first resin side surfaces 23. The plurality of first side leads 41 includes first side leads exposed from one of the first resin side surfaces 23 and first side leads exposed from the other of the first resin side surfaces 23. A part of each of the plurality of first side leads 41 is exposed from the resin back surface 22.

As shown in FIGS. 1 to 3, 6, and 7, the plurality of second side leads 42 are arranged to sandwich the die pad 3 in the second direction x. The plurality of second side leads 42 include second side leads arranged on one side (the right side in FIGS. 2 and 3) in the second direction x with respect to the die pad 3 and second side leads arranged on the other side (the left side in FIGS. 2 and 3) in the second direction x with respect to the die pad 3. The plurality of second side leads 42 are arranged along the first direction y on both sides of the die pad 3 in the second direction x. Each of the plurality of second side leads 42 is exposed from any of the pair of second resin side surfaces 24. The plurality of second side leads 42 includes second side leads exposed from one of the second resin side surfaces 24 and second side leads exposed from the other of the second resin side surfaces 24. A part of each of the plurality of second side leads 42 is exposed from the resin back surface 22.

The plurality of leads 4 (the plurality of first side leads 41 and the plurality of second side leads 42) include first leads 5 and second leads 6. In the semiconductor device A1, as shown in FIGS. 3 and 6, the plurality of first side leads 41 include two first leads 5 and a plurality of second leads 6, and the plurality of second side leads 42 include a plurality of second leads 6.

Figure 4:
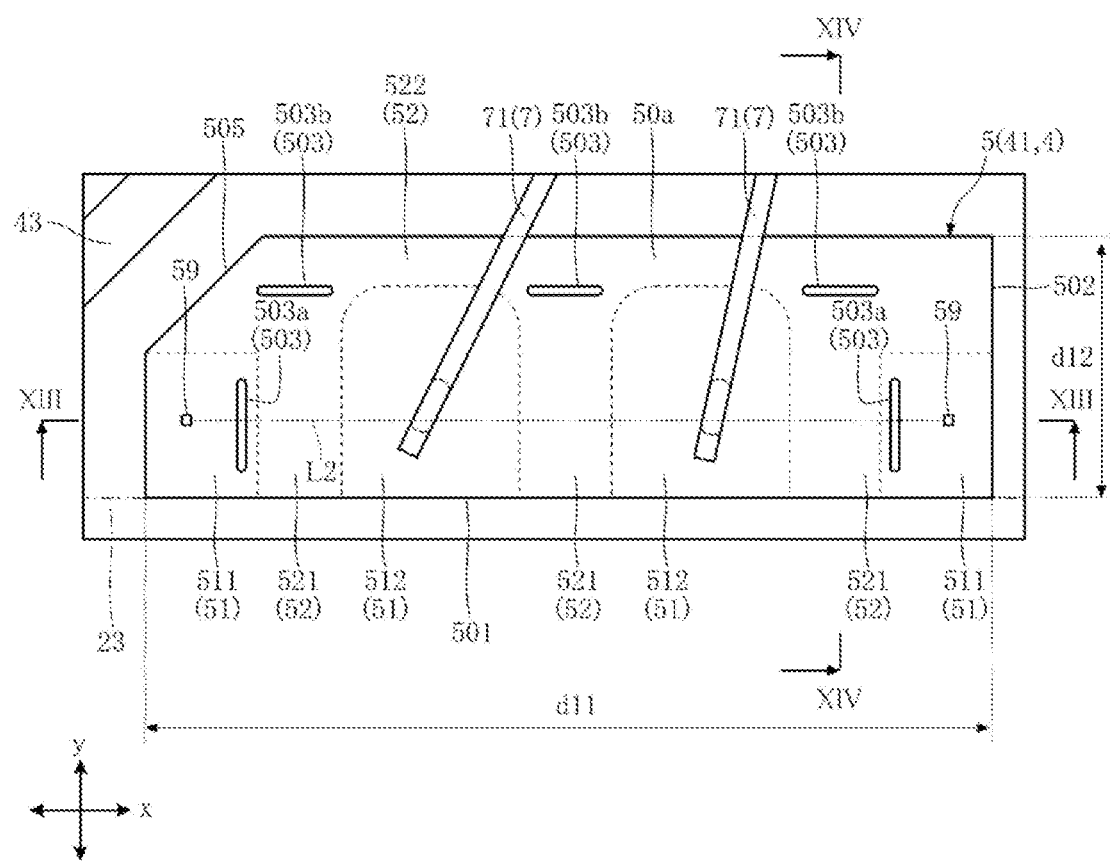
FIG. 4 is an enlarged view of a part (first lead) in FIG. 3.
Figure 13:
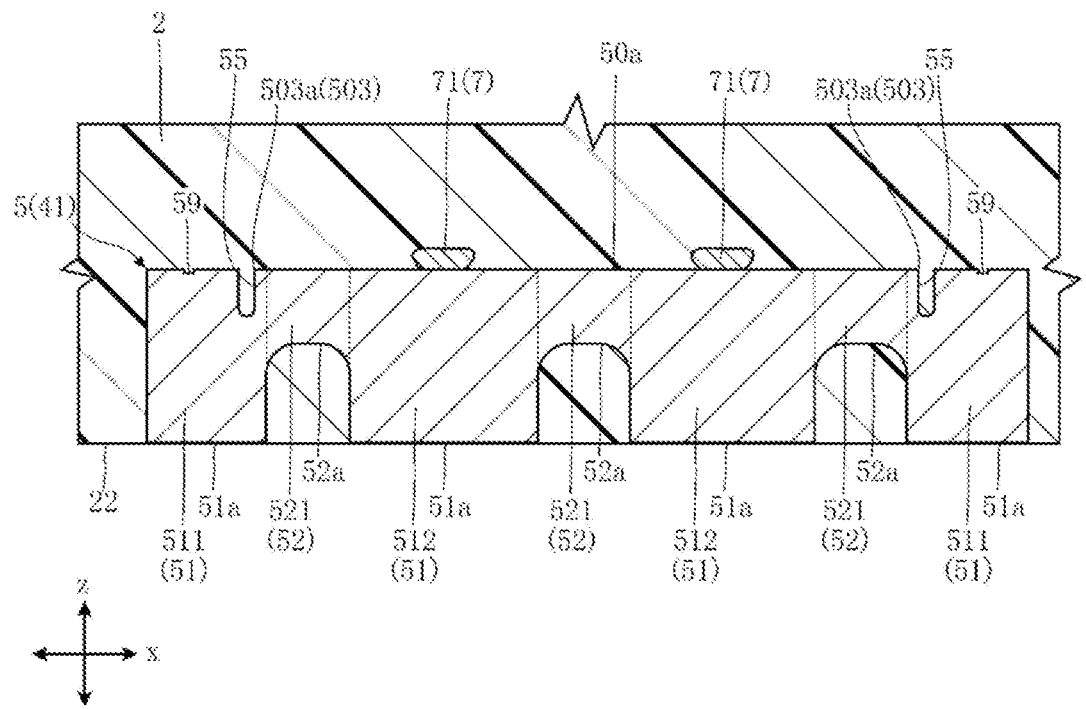
FIG. 13 is a cross-sectional view taken along line XIII-XIII in FIG. 4.

As shown in FIGS. 2 to 4 and 11, each first lead 5 is electrically connected to the first main surface electrode 12 of the semiconductor element 1 via the connecting member 7 (first connecting member 71). As shown in FIG. 3, in the semiconductor device A1, each first lead 5 is arranged closer to the power component 101 than the control circuit component 102 in the first direction y. As shown in FIGS. 4, 11 and 13, each first lead 5 has a first pad surface 50a and includes a plurality of first portions 51 and a plurality of second portions 52.

In each first lead 5, the first pad surface 50a faces one side (upper side) in the thickness direction z and faces the same side as the element main surface 10a, as shown in FIG. 11. The connecting member 7 (first connecting member 71) is bonded to the first pad surface 50a. The first pad surface 50a spans the plurality of first portions 51 and the plurality of second portions 52. The first pad surface 50a includes upper surfaces of the first portions 51 and the second portions 52. The first pad surface 50a is formed by, for example, plating Ni on a base, but the plating may not be performed. The first pad surface 50a has an end edge 501 and an end edge 502, as shown in FIG. 4.

As shown in FIG. 4, the end edge 501 overlaps with the outer edge 20 (first resin side surface 23) of the resin member 2 when viewed in the thickness direction z. The direction in which the end edge 501 extends is referred to as a "first width direction." In each of the first leads 5 included in the plurality of first side leads 41, the first width direction coincides with the second direction x. When the first leads 5 are included in the plurality of second side leads 42, in the first leads 5 of the second side leads 42, the first width direction coincides with the first direction y. The end edge 501 corresponds to the "first end edge" recited in the claims.

As shown in FIG. 4, the end edge 502 extends from the edge 501 toward the die pad 3 while being orthogonal to the end edge 501 when viewed in the thickness direction z. The direction in which the end edge 502 extends is referred to as a "first length direction." In each of the first leads 5 included in the plurality of first side leads 41, the first length direction coincides with the first direction y. When the first leads 5 are included in the plurality of second side leads 42, the first length direction of the first leads 5 of the second side leads 42 coincides with the second direction x. The end edge 502 corresponds to the "third end edge" recited in the claims.

In the semiconductor device A1, as shown in FIG. 4, the end edge 501 is longer than the end edge 502 on the first pad surface 50a of each first lead 5. The length d11 of the end edge 501 is, for example, 0.75 mm or more and 2.0 mm or less, and the length d12 of the end edge 502 is, for example, 0.3 mm or more and 1.2 mm or less. The length d11 of the end edge 501 and the length d12 of the end edge 502 are not limited to these values and may be appropriately changed according to the number of connecting members 7 (first connecting members 71) to be bonded to each first lead 5.

The first pad surface 50a includes a plurality of openings 503, as shown in FIGS. 3, 4 and 6. In the example shown in FIG. 4 and the like, each of the plurality of openings 503 is formed in a linear shape in the plan view. Unlike this configuration, instead of the linear opening 503, a configuration in which a plurality of dot-shaped openings 503 are linearly arranged may be used. As shown in FIG. 4, the plurality of openings 503 includes a pair of first openings 503a and a plurality of second openings 503b.

As shown in FIG. 4, the pair of first openings 503a among the plurality of openings 503 are located on the outermost side on one side and the other side in the first width direction (second direction x in the present embodiment). The pair of first openings 503a have a linear shape in the plan view and extend in the first length direction (the first direction y in the present embodiment). The plurality of second openings 503b are located between the pair of first openings 503a in the first width direction (the second direction x in the present embodiment). The plurality of second openings 503b have a linear shape in the plan view and extend in the first width direction (the second direction x in the present embodiment).

In each first lead 5, the plurality of first portions 51 are arranged in the first width direction. As shown in FIGS. 7 and 13, each of the plurality of first portions 51 has a back surface 51a. The back surface 51a faces the side opposite to the first pad surface 50a. The back surface 51a is flush with the resin back surface 22 and is exposed from the resin member 2 (resin back surface 22). The dimension of each first portion 51 in the thickness direction z, i.e., a distance from the first pad surface 50a to the back surface Ma along the thickness direction z, is, for example, 0.15 mm or more and 0.25 mm or less. In the example in which the die pad 3 and the plurality of leads 4 are formed from one lead frame, the thickness of each first portion 51 (dimension in the thickness direction z) may be equal to the thickness of the first portion 31 (in the thickness direction z).

In each first lead 5, the plurality of first portions 51 includes a pair of outer portions 511 and one or more inner portions 512 (two inner portions 512 in the semiconductor device A1), as shown in FIG. 4. The pair of outer portions 511 are located at both ends in the first width direction (second direction x in the present embodiment). The inner portions 512 are interposed between the pair of outer portions 511 in the first width direction. The connecting member 7 (first connecting member 71) is bonded to the inner portions 512. In the plan view, an area of each inner portion 512 is larger than the area of each of the pair of outer portions 511. A width of each inner portion 512 (a dimension along the first width direction, i.e., a dimension in the second direction x in the present embodiment) is, for example, equal to or larger than a wire diameter (diameter) of the first connecting member 71 described later and is 1.0 mm or less. By making the width of each inner portion 512 equal to or larger than the wire diameter of the first connecting member 71, it is possible to prevent a bonding portion of the first connecting member 71 from protruding from the inner portions 512 in the plan view, which makes it possible to suppress the first connecting member 71 from wobbling. On the other hand, by setting the width of each inner portion 512 to 1.0 mm or less, it is possible to suppress reduction in a size of the second portion 52 and prevent the first leads 5 from being removed from the resin member 2. In some embodiments, the width of each inner portion 512 is about twice the wire diameter of the first connecting member 71. The back surface Ma of each inner portion 512 corresponds to the "first exposed surface" recited in the claims.

As shown in FIG. 4, in the semiconductor device A1, each of the pair of first openings 503a is formed on the first pad surface 50a in each of the pair of outer portions 511. Each first opening 503a is formed on the side of each outer portion 511 closer to the inner portion 512 in the first width direction (second direction x). Each first opening 503a may be formed at a boundary between the outer portion 511 and the second portion 52 (for example, the connecting portion 521 described later) in the plan view.

In each first lead 5, the second portion 52 is connected to each of the plurality of first portions 51. As shown in FIG. 13, the second portion 52 is recessed from the back surface side of the first lead 5 and is thinner than the first portion 51. The second portion 52 is a portion thinned from the other side (lower side) of each first lead 5 in the thickness direction z. This thinning is performed by, for example, etching (half etching), but may be performed by press working. The second portion 52 has a back surface 52a. The back surface 52a faces the side opposite to the first pad surface 50a. The back surface 52a is a surface substantially parallel to the first pad surface 50a. The back surface 52a is located closer to the first pad surface 50a than the back surface 51a in the thickness direction z. The back surface 52a is covered with the resin member 2. Since the back surface 52a of the second portion 52 is covered with the resin member 2, removal of each first lead 5 from the resin member 2 is suppressed. The dimension of each second portion 52 in the thickness direction z, i.e., the distance from the first pad surface 50a to the back surface 52a along the thickness direction z, is, for example, 0.075 mm or more and 0.125 mm or less. In the example in which the die pad 3 and the plurality of leads 4 are formed from one lead frame, when the thickness of each first portion 51 is equal to the thickness of the first portion 31, the thickness of each second portion 52 (the dimension in the thickness direction z) may be about half of the thickness of each first portion 51.

In each first lead 5, the second portion 52 includes a plurality of connecting portions 521 and a connecting portion 522, as shown in FIG. 4. Each of the plurality of connecting portions 521 is connected to and interposed between two adjacent first portions of the plurality of first portions 51 in the first width direction (the second direction x in the present embodiment). In the semiconductor device A1, as shown in FIG. 4, the plurality of connecting portions 521 are respectively located between one outer portion 511 and the inner portion 512 adjacent thereto, between the two inner portions 512, and between the other outer portion 511 and the inner portion 512 adjacent thereto. The connecting portion 522 is connected to the plurality of connecting portions 521. The connecting portion 522 has a band-shape in the plan view and extends in the first width direction. The connecting portion 522 is located closer to the die pad 3 than the plurality of connecting portions 521 in the first length direction (the first direction y in the present embodiment). The second portion 52 may not include the connecting portion 522 and may include the plurality of connecting portions 521.

As shown in FIG. 4, in the semiconductor device A1, each of the plurality of second openings 503b described above is formed on the first pad surface 50a of the second portion 52. In the example shown in FIG. 4, for example, each second opening 503b is formed to overlap with a boundary between each connecting portion 521 and the connecting portion 522 in the plan view. Unlike this example, each second opening 503b may be out of alignment to one side in the first length direction (first direction y) from the boundary between each connecting portion 521 and the connecting portion 522 in the plan view.

Figure 14:
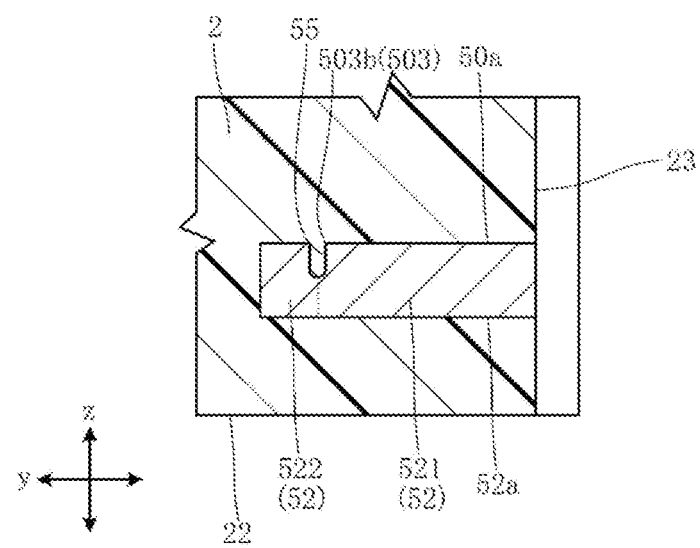
FIG. 14 is a cross-sectional view taken along line XIV-XIV in FIG. 4.

Each first lead 5 includes a plurality of recesses 55. As shown in FIGS. 13 and 14, each of the plurality of recesses 55 is recessed in the thickness direction z from the first pad surface 50a. As shown in FIGS. 13 and 14, each of the plurality of recesses 55 includes any one of a plurality of openings 503 (a plurality of first openings 503a and a plurality of second openings 503b) and extends from each opening 503 in the thickness direction z. The plurality of recesses 55 and the plurality of openings 503 are formed by, for example, etching. These may be formed by press working called stamping or may be formed by laser machining, instead of etching. For example, when formed by stamping, each recess 55 may be a V-shaped recess instead of the U-shaped recess shown in FIGS. 13 and 14.

In the semiconductor device A1, each first lead 5 is formed with a notch 505 as shown in FIG. 4. In the plan view, the notch 505 is formed along the adjacent third lead 43 and is substantially parallel to the adjacent third lead 43.

Each first lead 5 is formed with a pair of clamp marks 59. Each of the pair of clamp marks 59 is recessed in the thickness direction z from the first pad surface 50a. Each clamp mark 59 is a pressing mark formed by a clamp member described later and exhibits a scratch-like shape slightly recessed from the first pad surface 50a. One pair of clamp marks 59 is formed on each of one pair of outer portions 511. In some embodiments, as shown in FIG. 4, in each first lead 5, the bonding portion of each first connecting member 71 overlaps with a line segment L2 connecting the pair of clamp marks 59 in the plan view. The clamp marks 59 may not be formed on each first lead 5.

Figure 15:
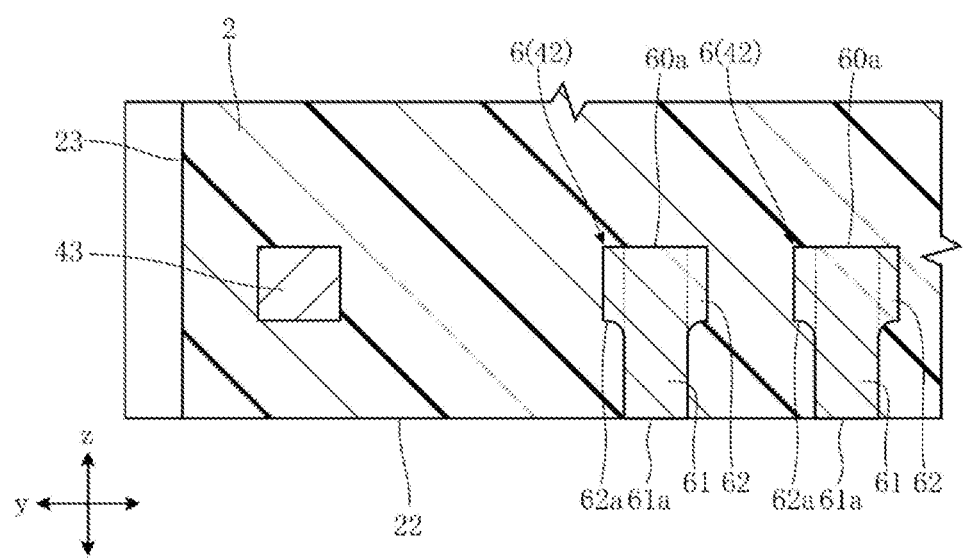
FIG. 15 is a cross-sectional view taken along line XV-XV in FIG. 5.

The second lead 6 is electrically connected to the second main surface electrode 13 of the semiconductor element 1 via the connecting member 7 (second connecting member 72). As shown in FIGS. 5, 11, and 15, each second lead 6 has a second pad surface 60a and includes a first portion 61 and a second portion 62.

In each second lead 6, the second pad surface 60a faces the same side as the first pad surface 50a. Therefore, the second pad surface 60a faces one side (upper side) in the thickness direction z. The connecting member 7 (second connecting member 72) is bonded to the second pad surface 60a. The second pad surface 60a is subjected to, for example, a process of plating a base with a Ni layer and an Ag layer in the named order, but such a process of plating may not be performed or a process of plating with other conductive materials may be performed. The second pad surface 60a has an end edge 601 and an end edge 602, as shown in FIG. 5.

The end edge 601 overlaps with the outer edge 20 of the resin member 2 when viewed in the thickness direction z. The direction in which the end edge 601 extends is referred to as a "second width direction." In each of the second leads 6 of the plurality of first side leads 41, the second width direction coincides with the second direction x, and in each of the second leads 6 of the plurality of second side leads 42, the second width direction coincides with the first direction y. The end edge 601 corresponds to the "second end edge" recited in the claims.

The end edge 602 extends from the end edge 601 toward the die pad 3 while being orthogonal to the end edge 601 when viewed in the thickness direction z. The direction in which the end edge 602 extends is referred to as a "second length direction." In each of the second leads 6 of the plurality of first side leads 41, the second length direction coincides with the first direction y, and in each of the second leads 6 of the plurality of second side leads 42, the second length direction coincides with the second direction x. As shown in FIG. 5, the end edge 601 is shorter than the end edge 602. A length d21 of the end edge 601 is, for example, 0.15 mm or more and 0.3 mm or less, and a length d22 of the end edge 602 is, for example, 0.5 mm or more and 1.0 mm or less. The end edge 602 corresponds to the "fourth end edge" recited in the claims.

In each second lead 6, the connecting member 7 (second connecting member 72) is bonded to the first portion 61 as shown in FIGS. 5 and 11. As shown in FIG. 11, the first portion 61 has a back surface 61a. The back surface 61a faces the side opposite to the second pad surface 60a. The back surface 61a is flush with the resin back surface 22 and is exposed from the resin member 2 (resin back surface 22). The back surface 61a corresponds to the "second exposed surface" recited in the claims. The area of the back surface 61a is smaller than the area of the back surface 51a of each inner portion 512 of the first lead 5. The dimension of the first portion 61 in the thickness direction z, i.e., the distance from the second pad surface 60a to the back surface 61a along the thickness direction z, is, for example, 0.15 mm or more and 0.25 mm or less. In the example in which the die pad 3 and the plurality of leads 4 are formed from one lead frame, the thickness of each first portion 61 (the dimension in the thickness direction z) may be equal to the thickness of the first portion 31.

In each second lead 6, the second portion 62 is connected to the first portion 61, as shown in FIGS. 5 and 11. As shown in FIG. 11, the second portion 62 is recessed from the back surface side of the second lead 6 and is thinner than the first portion 61. The second portion 62 is a portion of each second lead 6 thinned from the other side (lower side) in the thickness direction z. This thinning is performed by, for example, etching (half etching), but may be performed by press working. As shown in FIG. 11, the second portion 62 has a back surface 62a. The back surface 62a faces the side opposite to the second pad surface 60a. The back surface 62a is a surface substantially parallel to the second pad surface 60a. The back surface 62a is located closer to the second pad surface 60a than the back surface 61a in the thickness direction z. The back surface 62a is covered with the resin member 2. Since the back surface 62a of the second portion 62 is covered with the resin member 2, removal of each second lead 6 from the resin member 2 is suppressed. The dimension of the second portion 62 in the thickness direction z, i.e., the distance from the second pad surface 60a to the back surface 62a along the thickness direction z, is, for example, 0.075 mm or more and 0.125 mm or less. In the example in which the die pad 3 and the plurality of leads 4 are formed from one reed frame, when the thickness of the first portion 61 is equal to the thickness of the first portion 31, the thickness of the second portion 62 (the dimension in the thickness direction z) may be about half of the thickness of the first portion 61.

As shown in FIGS. 3 and 6, the area of the first pad surface 50a is larger than the area of the second pad surface 60a. In the present embodiment, the length d12 of the end edge 502 is substantially equal to the length d22 of the end edge 602, and the length d11 of the end edge 501 is larger than the length d21 of the end edge 601. For example, the length d11 of the end edge 501 is 3 times or more and 20 times or less larger than the length d21 of the end edge 601.

As shown in FIGS. 2, 3, 6, and 7, the plurality of third leads 43 extend from the outer edge of the die pad 3 (outer edge 301 of the die pad main surface 30a) toward the outer edge 20 of the resin member 2 in the plan view. In the semiconductor device A1, each of the plurality of third leads 43 extends from the four corners of the die pad 3 and extends toward the four corners of the resin member 2 in the plan view. Each of the plurality of third leads 43 is integrally formed with the die pad 3. Each of the plurality of third leads 43 has a smaller dimension in the thickness direction z than the die pad 3. Both sides of each of the plurality of third leads 43 in the thickness direction z are covered with the resin member 2. Each of the plurality of third leads 43 is a so-called hanging lead. As shown in FIGS. 12 and 15, both sides of each of the plurality of third leads 43 in the thickness direction z are covered with the resin member 2. The upper surface of each third lead 43 (the surface facing one side in the thickness direction z) is flush with the die pad main surface 30a, and the lower surface of each third lead 43 (the surface facing the other side in the thickness direction z) is flush with the back surface 32a of the second portion 32. The end surface of each of the third leads 43 overlapping with the outer edge 20 (the pair of first resin side surfaces 23 and the pair of second resin side surfaces 24) of the resin member 2 in the plan view is exposed from the resin member 2. Each of the plurality of third leads 43 is made of, for example, copper or a copper alloy.

The plurality of connecting members 7 electrically connects two portions spaced apart from each other. Each of the plurality of connecting members 7 electrically connects any one of the plurality of main surface electrodes 11 and any one of the plurality of leads 4. The plurality of connecting members 7 include a plurality of first connecting members 71 and a plurality of second connecting members 72.

Each of the plurality of first connecting members 71 is, for example, a bonding wire, and contains aluminum or an aluminum alloy as a constituent material. Each of the plurality of first connecting members 71 is bonded to any one of the plurality of first main surface electrodes 12 and any one of the plurality of first leads 5 to electrically connect them. Each first connecting member 71 is bonded by, for example, wedge bonding. The material and bonding method of each first connecting member 71 are not limited to the above-mentioned examples. For example, the constituent material of each first portion 61 may include gold or a gold alloy, or copper or a copper alloy instead of aluminum or an aluminum alloy. Further, each first connecting member 71 may be bonded by ball bonding. In addition, each of the plurality of first connecting members 71 may be, for example, a bonding ribbon instead of the bonding wire.

Each of the plurality of second connecting members 72 is, for example, a bonding wire, and the constituent material thereof includes gold or a gold alloy, or copper or a copper alloy. Each of the plurality of second connecting members 72 is bonded to any one of the plurality of second main surface electrodes 13 and any one of the plurality of second leads 6 to electrically connect them. Each second connecting member 72 is bonded by, for example, ball bonding. The material and bonding method of each second connecting member 72 are not limited to the above-mentioned examples.

In the examples shown in FIGS. 2, 3, and 11, each of the plurality of first connecting members 71 has, for example, a larger wire diameter than each of the plurality of second connecting members 72. However, the present disclosure is not limited thereto.

In the semiconductor device A1, as described above, each first connecting member 71 is bonded by wedge bonding. In the wedge bonding, the first connecting member 71 and an object to be bonded are bonded by applying ultrasonic vibration while pressing the first connecting member 71 against the object to be bonded (the first main surface electrode 12 and the first lead 5). The object to be bonded is fixed with a clamp member to suppress fluctuation of the object to be bonded due to a pressing force and the ultrasonic vibration at this time. The clamp member has tip portions formed in the shape of a thin rod, and the object to be bonded is fixed by pressing the object to be bonded with the tip portions. In the present embodiment, each first connecting member 71 is bonded to the first main surface electrode 12 and the first lead 5. Therefore, the die pad 3 and the first lead 5 are fixed by the clamp member. At this time, by pressing the die pad 3 with the clamp member (the tip portions thereof), a pair of clamp marks 39 are formed by the pressing force of the clamp member. Further, by pressing the first lead 5 with the clamp member (the tip portions thereof), a pair of clamp marks 59 are formed by the pressing force of the clamp member. Even when the second connecting member 72 is bonded, ultrasonic vibration may be applied while pressing the second connecting member 72 against the object to be bonded (the main surface electrode 11 and the second lead 6). However, the pressing force and the ultrasonic vibration at that time are weaker than the pressing force and ultrasonic vibration when bonding the first connecting member 71. The clamp member may not when bonding the second connecting member 72. The bonding of each second connecting member 72 is performed after the bonding of each first connecting member 71.

The actions and effects of the semiconductor device A1 are as follows.

In the semiconductor device A1, the plurality of leads 4 include the first lead 5 and the second lead 6. The first lead 5 has the first pad surface 50a to which the first connecting member 71 is bonded, and the second lead 6 has a second pad surface 60a to which the second connecting member 72 is bonded. When viewed in the thickness direction z, the first pad surface 50a is larger than the second pad surface 60a. According to this configuration, it is possible to bond a larger number of first connecting members 71 to the first lead 5 or bond a connecting member 7 having a large wire diameter to the first lead 5. Therefore, it is possible to allow a large current to flow through the semiconductor element 1. Further, the first lead 5 is larger than the second lead 6 and, therefore, has good conductivity. Accordingly, the semiconductor device A1 has a package structure which may be used to improve the performance.

In the semiconductor device A1, the semiconductor element 1 includes the power component 101 and the control circuit component 102. The power component 101 often operates with a relatively larger current than the control circuit component 102. Therefore, in the semiconductor device A1, the first lead 5 may be installed at the plurality of leads 4, which is a package structure that may be used to mount such a semiconductor element 1.

In the semiconductor device A1, the first lead 5 is arranged at a position closer to the power component 101 than the control circuit component 102. According to this configuration, it is possible to shorten the distance between the first main surface electrode 12 of the semiconductor element 1 and the first lead 5, which is an arrangement that may be used to bond the first connecting member 71.

In the semiconductor device A1, the plurality of first side leads 41 include the first lead 5, and the plurality of second side leads 42 do not include the first lead 5. Further, each first connection member 71 is bonded to each first lead 5 and the semiconductor element 1 (each first main surface electrode 12) by wedge bonding. When the first connecting member 71 is wedge-bonded to the first lead 5 of the plurality of first side leads 41 and the semiconductor element 1 (first main surface electrode 12), for example, both ends of the die pad 3 in the second direction x are pressed by the clamp member. At this time, for example, the clamp member presses one end of the die pad 3 in the second direction x from one side in the second direction x with respect to the one end, and the clamp member presses the other end of the die pad 3 in the second direction x from the other side in the second direction x with respect to the other end. In the semiconductor device A1, one end of the die pad 3 in the second direction x is the third portion 33, and the other end of the die pad 3 in the second direction x is the fourth portion 34. With such a pressing method, it becomes difficult to connect the semiconductor element 1 and the plurality of second side leads 42 by the first connecting member 71 due to the arrangement of the clamp member. Therefore, in the semiconductor device A1, by adopting a configuration in which the plurality of second side leads 42 do not include the first lead 5, each first connecting member 71 may not be bonded to the plurality of second side leads 42. This makes it possible to suppress a difficulty in bonding the first connecting member 71 to the plurality of second side leads 42 as described above. In other words, the third portion 33 and the fourth portion 34 are arranged on the side where the plurality of second side leads 42 not including the first lead 5 are arranged, with respect to the first portion 31, to suppress the aforementioned difficulty.

In the semiconductor device A1, each of the first leads 5 faces the side opposite to the first pad surface 50a in the thickness direction z and has the plurality of first exposed surfaces exposed from the resin back surface 22. In the semiconductor device A1, the first exposed surface is the back surface 51a in each inner portion 512. Further, the second lead 6 has the second exposed surface facing the side opposite to the second pad surface 60a in the thickness direction z and exposed from the resin back surface 22. In the semiconductor device A1, the second exposed surface is the back surface 61a of the first portion 61. When viewed in the thickness direction z, the back surface 51a (each first exposed surface) of each inner portion 512 is larger than the back surface 61a (second exposed surface). According to this configuration, when the semiconductor device A1 is mounted on a circuit board of an electronic device or the like, a bonding area between the back surface 51a of each inner portion 512 of the first portion 51 and the circuit board is larger than a bonding area between the back surface 61a of the second lead 6 and the circuit board. Therefore, the conductivity of the semiconductor device A1 from the first lead 5 to the circuit board may be made better than the conductivity from the second lead 6 to the circuit board. Further, in the semiconductor device A1, as described above, the first pad surface 50a of the first lead 5 is larger than the second pad surface 60a of the second lead 6. Therefore, it is easy to make the back surface 51a of each inner portion 512 larger than each back surface 61a.

In the semiconductor device A1, the die pad 3 has the die pad main surface 30a and includes the first portion 31, the second portion 32, the third portion 33 and the fourth portion 34. The die pad main surface 30a spans the first portion 31, the second portion 32, the third portion 33 and the fourth portion 34. The back surface 31a of the first portion 31, the back surface 33a of the third portion 33, and the back surface 34a of the fourth portion 34 are flush with each other, and the back surface 32a of the second portion 32 is located on the side of the die pad main surface 30a in the thickness direction z from the back surface 31a. In this configuration, the second portion 32 is thinner than the first portion 31, and the third portion 33 and the fourth portion 34 have the same thickness as the first portion 31. When bonding the first connecting member 71, the die pad 3 (and the semiconductor element 1 mounted thereon) may be fixed by, for example, a clamp member. At this time, the clamp member presses a periphery of the first portion 31 on which the semiconductor element 1 is mounted. Unlike the semiconductor device A1, in a semiconductor device in which the die pad 3 does not include the third portion 33 and the fourth portion 34, the second portion 32 is arranged on the entire circumference of the first portion 31. In this case, the second portion 32 is pressed by the clamp member to fix the die pad 3. However, since the second portion 32 is thinner than the first portion 31, the die pad 3 may be deformed or cracked due to the pressing force of the clamp member. When the die pad 3 is deformed by the pressing force of the clamp member, the semiconductor element 1 mounted on the die pad 3 may be peeled off. Therefore, in the semiconductor device A1, the third portion 33 and the fourth portion 34 may be pressed with the clamp member by providing the third portion 33 and the fourth portion 34 having the same thickness as the first portion 31 around the first portion 31. Accordingly, the semiconductor device A1 may suppress deformation and cracking of the die pad 3, which is a package structure that may be used to achieve a high quality.

In the semiconductor device A1, the pair of openings 302 are formed on the die pad main surface 30a of the die pad 3. The pair of openings 302 are formed at a boundary between the first portion 31 and the third portion 33 and a boundary between the first portion 31 and the fourth portion 34. According to this configuration, it is possible to determine positions of the third portion 33 and the fourth portion 34 with reference to the pair of openings 302. For example, in the example shown in FIG. 6, referring to the pair of openings 302, it may be determined that the regions outside the openings 302 are the positions of the third portion 33 and the fourth portion 34, i.e., the regions where the clamping may be performed.

In the semiconductor device A1, the first lead 5 has the first pad surface 50a and includes the first portion 51 and the second portion 52. The first pad surface 50a spans the first portion 51 and the second portion 52. The back surface 52a of the second portion 52 is located closer to the first pad surface 50a than the back surface 51a of the first portion 51 in the thickness direction z. In this configuration, the second portion 52 is thinner than the first portion 51. Therefore, when the first connecting member 71 is bonded to the second portion 52, the first lead 5 may be deformed or cracked. This is because when the first connecting member 71 is bonded, the first connecting member 71 is pressed against the first lead 5, such that the pressing force is applied to the first lead 5 to generate a stress in the first lead 5. Further, when bonding the first connecting member 71, the first lead 5 may be pressed by the clamp member to fix the first lead 5. At this time, when the second portion 52 is pressed by the clamp member, the first lead 5 may be deformed or cracked due to the pressing force of the clamp member. When the first lead 5 is deformed by the pressing force of the clamp member, it may not be possible to secure an appropriate bonding strength when bonding the first connecting member 71. Therefore, in the semiconductor device A1, by forming the plurality of openings 503 on the first pad surface 50a, it is possible to determine the position of the first portion 51 with reference to the plurality of openings 503. That is, the semiconductor device A1 may determine the position suitable when bonding the first connecting member 71 and the position suitable when clamping with the clamp member. Accordingly, the semiconductor device A1 may suppress deformation and cracking of the first lead 5, which is a package structure that may be used to achieve a high quality.

In the semiconductor device A1, the plurality of openings 503 include the plurality of first openings 503a and the plurality of second openings 503b. According to this configuration, the regions to be pressed by the clamp member (the positions of the pair of outer portions 511) may be determined by the plurality of first openings 503a, and the region to be bonded with the first connecting member 71 (the position of the inner portion 512) may be determined by the plurality of second openings 503b. For example, in the examples shown in FIG. 4 and the like, referring to the pair of first openings 503a, it may be determined that both outer regions of the pair of first openings 503a are the positions of the pair of outer portions 511, i.e., the regions where the clamping may be performed. Further, for example, in the examples shown in FIG. 4 and the like, referring to the plurality of second openings 503b, it may be determined that the regions outside the second openings 503b are the positions of the connecting portions 521 (second portions 52), i.e., the regions unsuitable when bonding the first connecting member 71.

Next, other embodiments of the semiconductor device of the present disclosure will be described.

Figure 16:
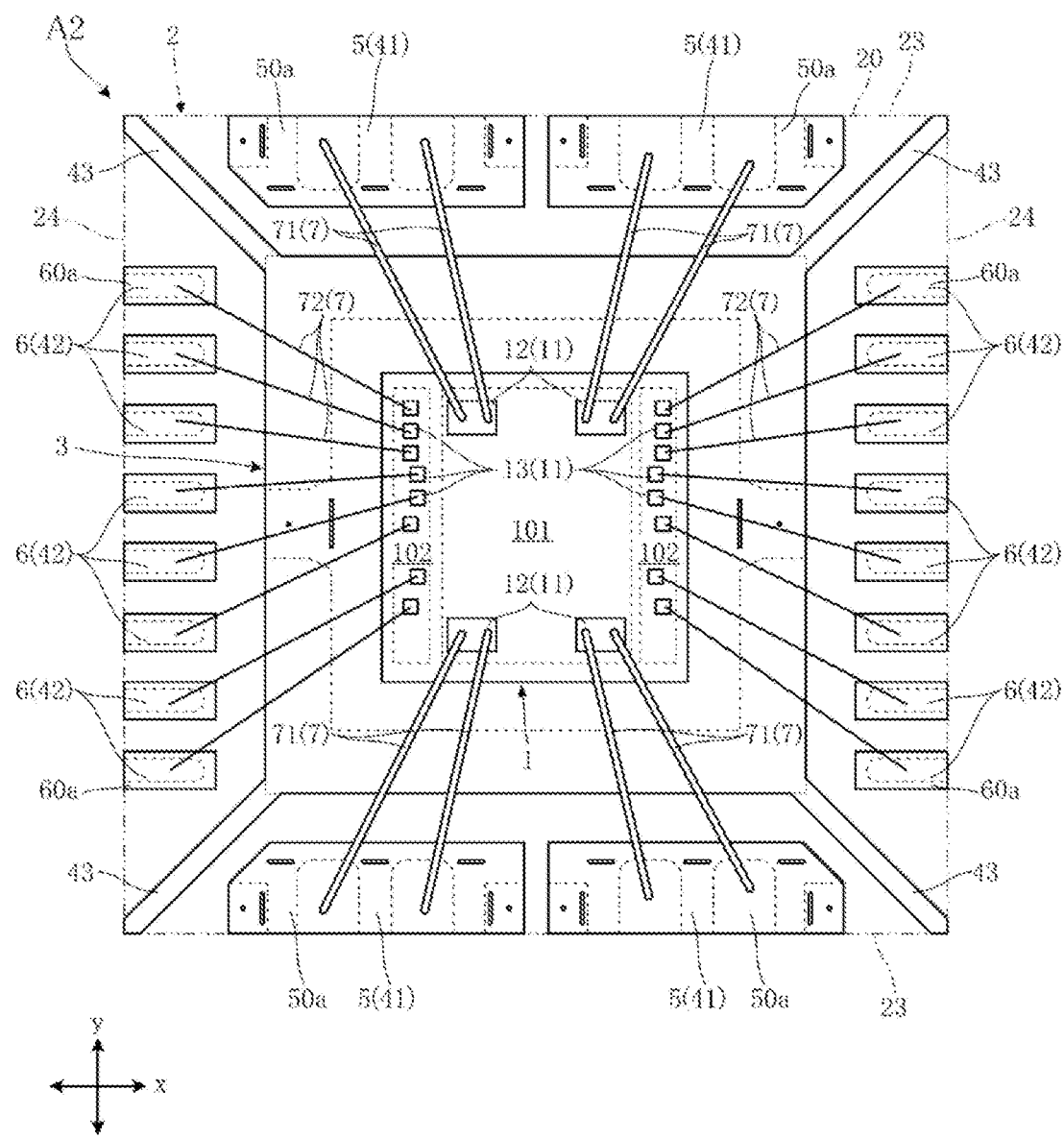
FIG. 16 is a plan view showing a semiconductor device according to a second embodiment of the present disclosure and is a view in which a resin member is made transparent.

FIG. 16 shows a semiconductor device A2 according to a second embodiment of the present disclosure. As shown in FIG. 16, in the semiconductor device A2, the plurality of first side leads 41 do not include the second lead 6, and all of the plurality of first side leads 41 include the first leads 5. In the example shown in FIG. 16, the plurality of first side leads 41 include two first leads 5 on one side of the die pad 3 in the first direction y, and include two first leads 5 on the other side of the die pad 3 in the first direction y.

The semiconductor device A2 also has the same effects as those of the semiconductor device A1. Further, according to the arrangement of the first leads 5 in the semiconductor device A2, for example, when the first main surface electrodes 12 are arranged on both sides of the semiconductor element 1 in the first direction y as shown in FIG. 16, it is possible to shorten the distance from each first main surface electrode 12 to each first lead 5. The configuration of the semiconductor element 1 shown in FIG. 16 is an example. That is, the number and arrangement of the power components 101, the number and arrangement of the control circuit components 102, the number and arrangement of the main surface electrodes 11 (each first main surface electrode 12 and each second main surface electrode 13), and the like may be appropriately changed.

Figure 17:
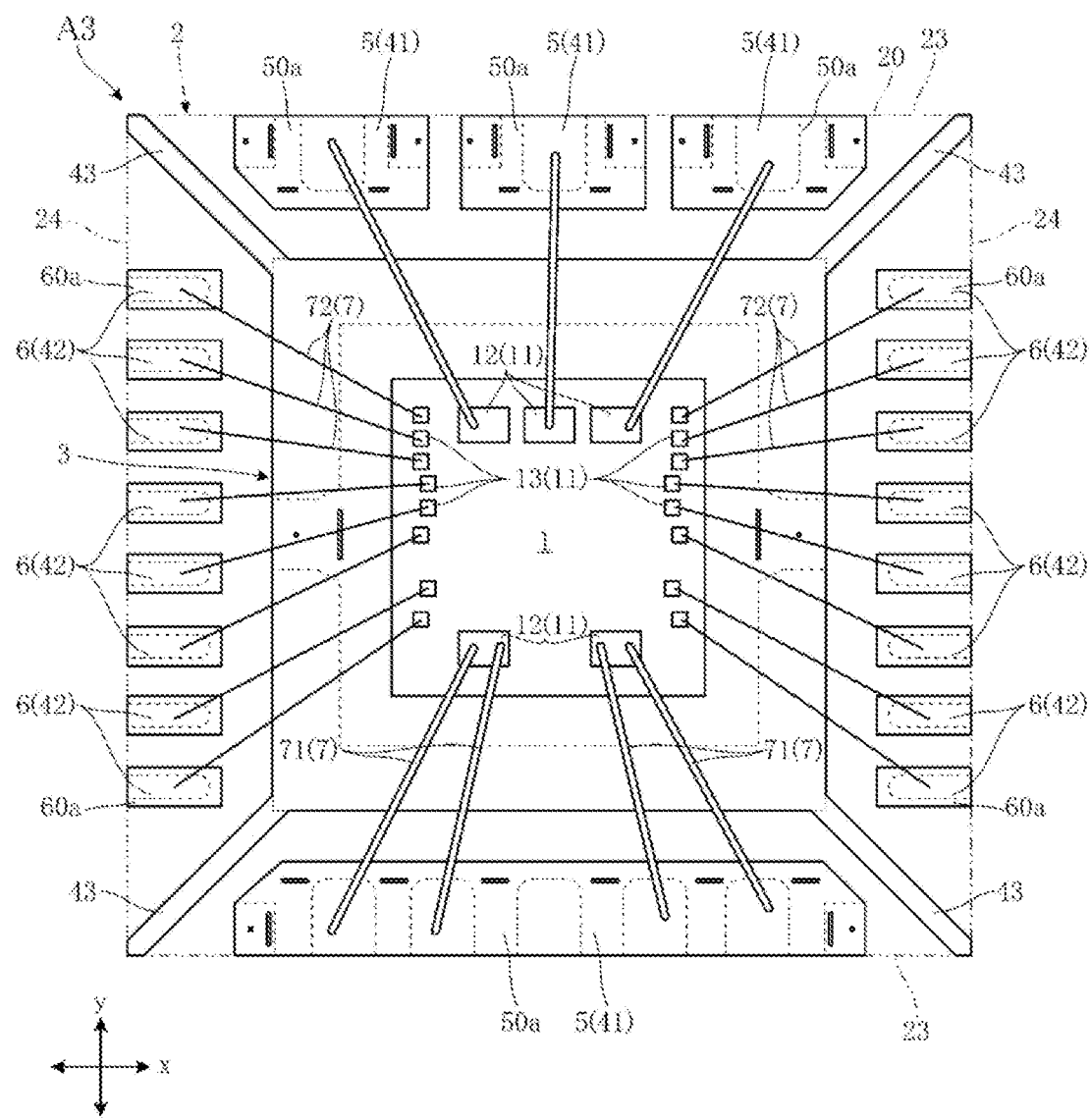
FIG. 17 is a plan view showing a semiconductor device according to a third embodiment of the present disclosure and is a view in which a resin member is made transparent.

FIG. 17 shows a semiconductor device A3 according to a third embodiment of the present disclosure. As shown in FIG. 17, in the semiconductor device A3, like the semiconductor device A2, the plurality of first side leads 41 do not include the second lead 6, and all of the plurality of first side leads 41 include the first leads 5. However, in the semiconductor device A3, unlike the semiconductor device A2, three first leads 5 are arranged on one side (upper side in FIG. 17) of the die pad 3 in the first direction y, and one first lead 5 is arranged on the other side (lower side in FIG. 17) of the die pad 3 in the first direction y.

The semiconductor device A3 also has the same effects as those of the semiconductor device A1. Further, according to the semiconductor device A3, the number and size of each first lead 5 may be appropriately changed in consideration of the magnitude of the current flowing through each first lead 5. For example, as the current increases, a plan-view area of the first lead 5 becomes larger, and as the current decreases, the plan-view area of the first lead 5 becomes smaller.

Figure 18:
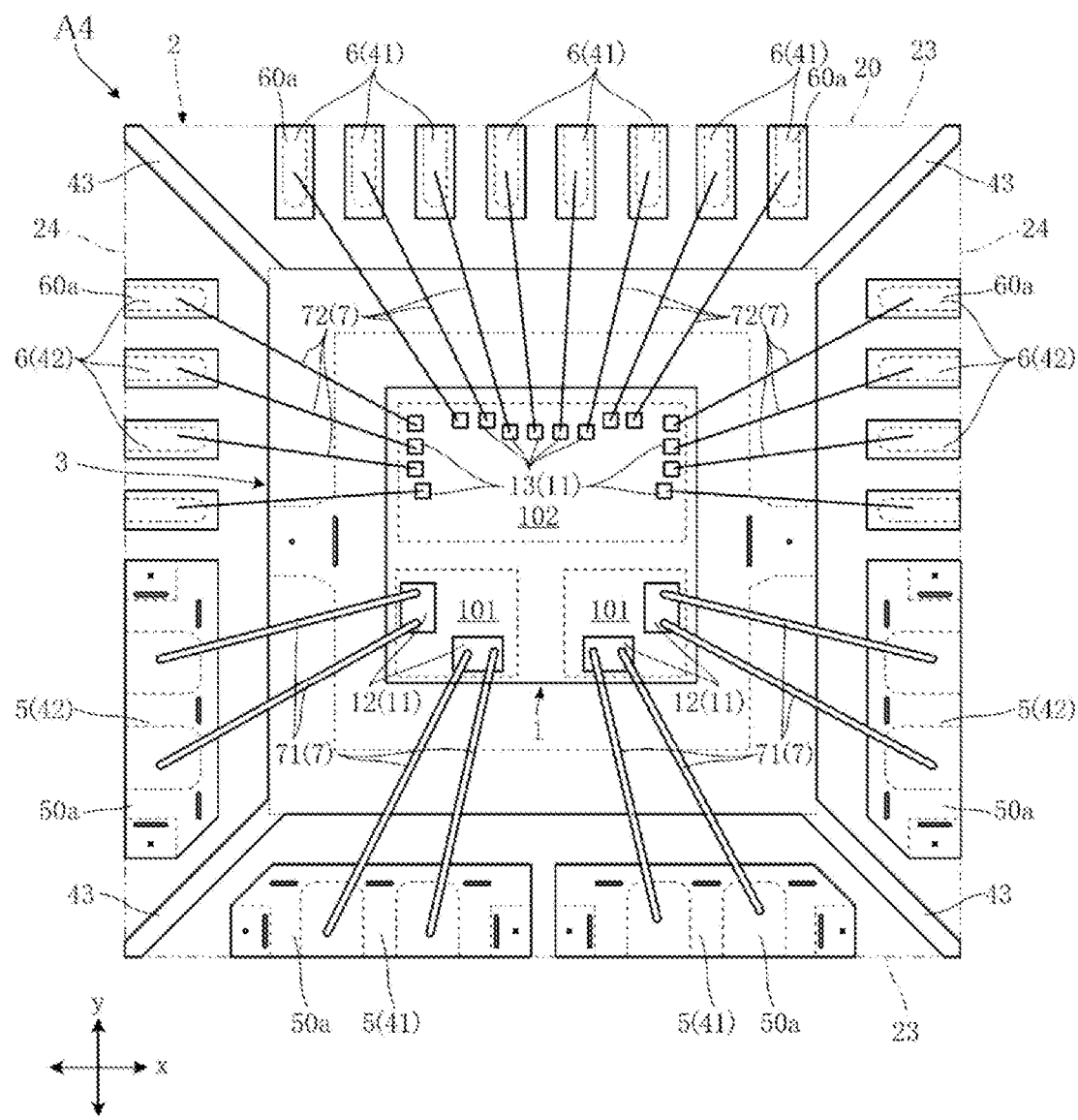
FIG. 18 is a plan view showing a semiconductor device according to a fourth embodiment of the present disclosure and is a view in which a resin member is made transparent.

FIG. 18 shows a semiconductor device A4 according to a fourth embodiment of the present disclosure. As shown in FIG. 18, in the semiconductor device A4, not only the plurality of first side leads 41 but also the plurality of second side leads 42 include the first leads 5.

The semiconductor device A4 also has the same effects as those of the semiconductor device A1. Further, according to the arrangement of the first leads 5 in the semiconductor device A4, for example, when the plurality of first main surface electrodes 12 are collectively arranged on the other side (lower side in FIG. 18) of the semiconductor element 1 in the first direction y in a plan view as shown in FIG. 18, it is possible to shorten the distance from each first main surface electrode 12 to each first lead 5. The configuration of the semiconductor element 1 shown in FIG. 18 is an example.

As may be understood from the semiconductor devices A1 to A4 described above, in the semiconductor device of the present disclosure, the number, arrangement, size, and the like of the first leads 5 and the second leads 6 in the plurality of leads 4 are appropriately changed according to the configuration of the semiconductor element 1.

Figure 19:
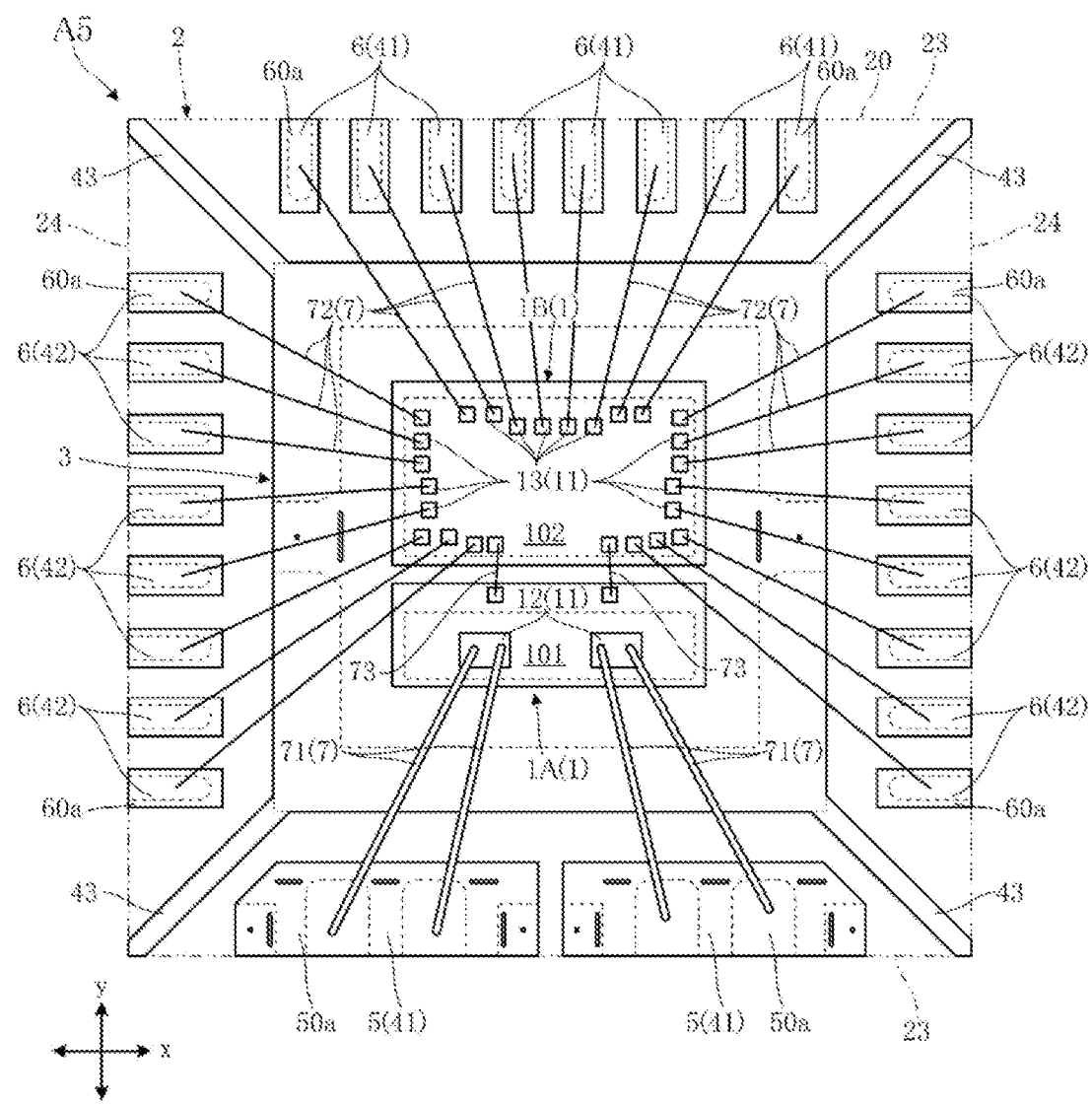
FIG. 19 is a plan view showing a semiconductor device according to a fifth embodiment of the present disclosure and is a view in which a resin member is made transparent.

FIG. 19 shows a semiconductor device A5 according to a fifth embodiment of the present disclosure. As shown in FIG. 19, unlike the semiconductor device A1, the semiconductor device A5 includes a plurality of semiconductor elements 1. In the example shown in FIG. 19, the semiconductor device A5 includes two semiconductor elements 1. The two semiconductor elements 1 include a semiconductor element 1A including a power component 101 and a semiconductor element 1B including a control circuit component 102. The semiconductor element 1A is, for example, a power element such as a transistor. The semiconductor element 1B is a driver IC configured to control a switching operation of the semiconductor element 1A. As shown in FIG. 19, the semiconductor device includes a third connecting member 73 configured to electrically connect the semiconductor element 1A and the semiconductor element 1B. The third connecting member 73 is, for example, a bonding wire. A detection signal from the semiconductor element 1A to the semiconductor element 1B and a drive signal that may be used to control the switching operation from the semiconductor element 1B to the semiconductor element 1A are transmitted via the third connecting member 73.

The semiconductor device A5 also has the same effects as those of the semiconductor device A1. Further, as may be understood from the example shown in the semiconductor device A5, the semiconductor device of the present disclosure is not limited to the configuration including one semiconductor element 1 and may also include a plurality of semiconductor elements 1.

Figure 20:
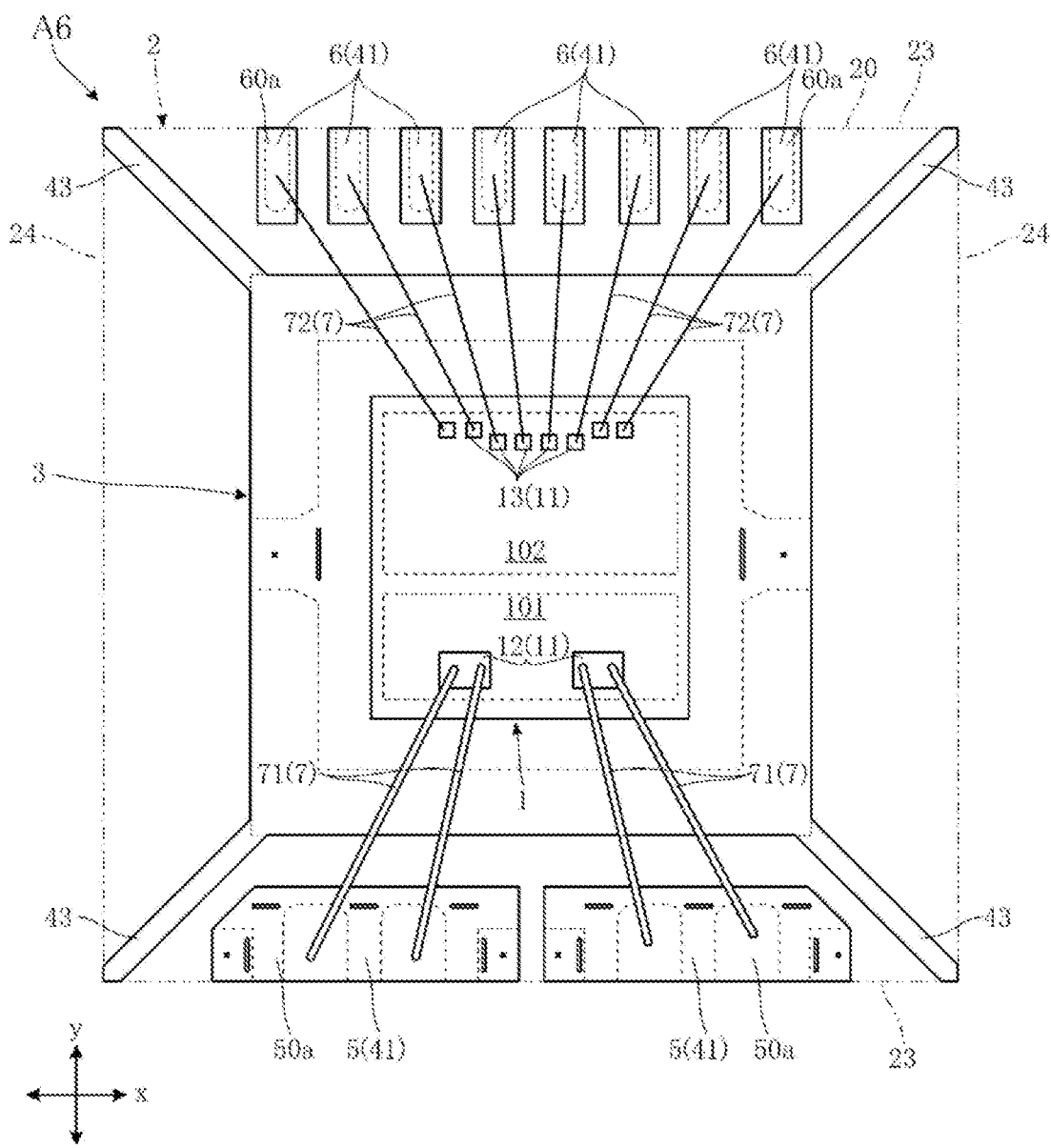
FIG. 20 is a plan view showing a semiconductor device according to a sixth embodiment of the present disclosure and is a view in which a resin member is made transparent.

FIG. 20 shows a semiconductor device A6 according to a sixth embodiment of the present disclosure. As shown in FIG. 20, unlike the semiconductor device A1, the semiconductor device A6 has a package structure of, for example, a MAP type SON. Therefore, in the semiconductor device A6, as shown in FIG. 20, the plurality of leads 4 do not include the second side lead 42.

Figure 21:
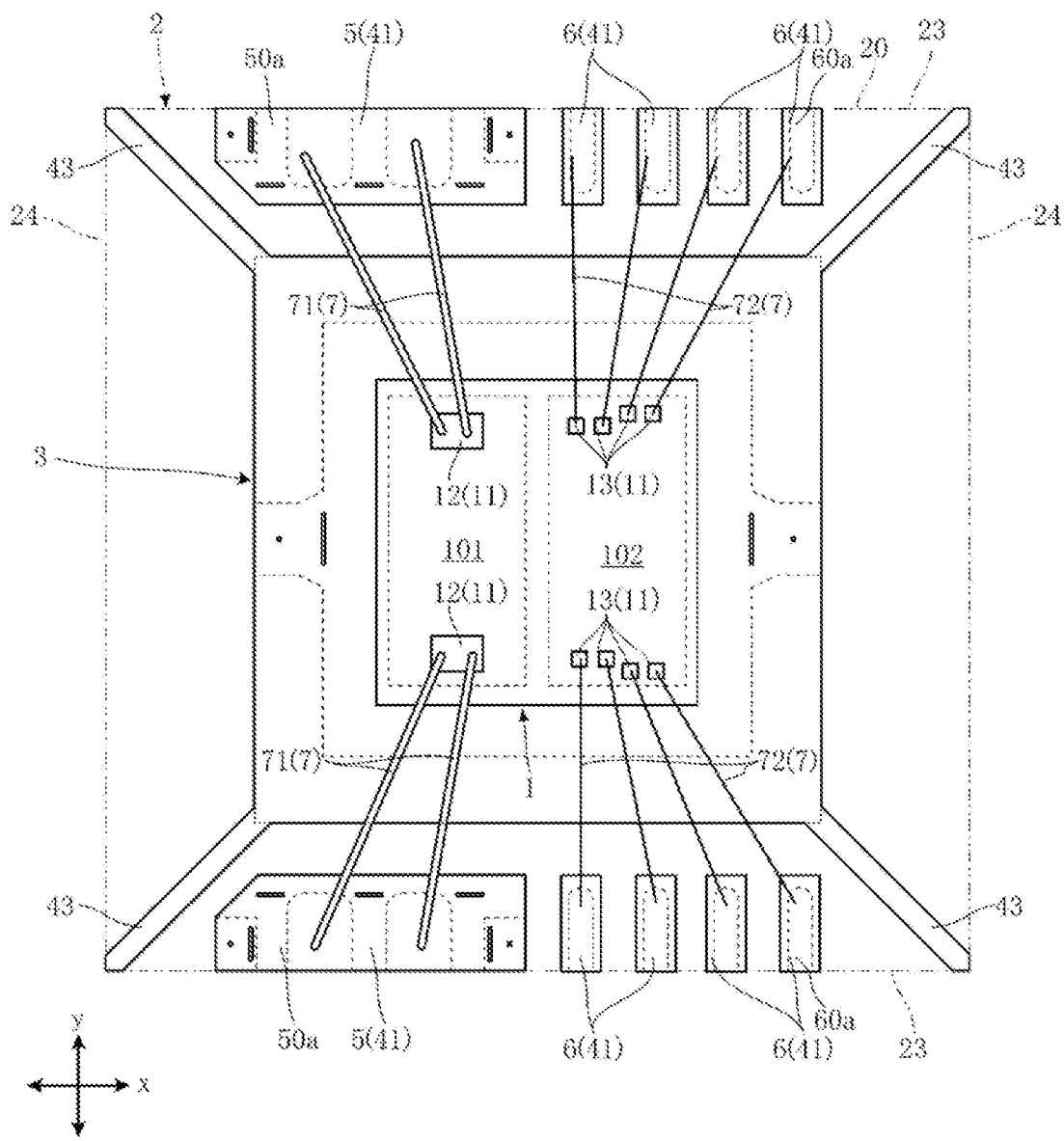
FIG. 21 is a plan view showing a semiconductor device according to a modification of the sixth embodiment of the present disclosure and is a view in which a resin member is made transparent.

The semiconductor device A6 also has the same effects as those of the semiconductor device A1. Further, as may be understood from the example shown in the semiconductor device A6, the semiconductor device of the present disclosure is not limited to the QFN and may be applied to various package structures. In the semiconductor device A6 as well, the number and arrangement of the first leads 5 may be appropriately changed according to the configuration of the semiconductor element 1, as in the examples shown in the semiconductor devices A1 to A4. For example, FIG. 21 shows an example in which the arrangement of the first leads 5 is changed according to the configuration of the semiconductor element 1. In the semiconductor device shown in FIG. 21, a power component 101 and a control circuit component 102 of the semiconductor element 1 are arranged side by side in the second direction x in a plan view. Further, the semiconductor device A6 may also be configured to include a plurality of semiconductor elements 1 as in the example shown in the semiconductor device A5.

Figure 22:
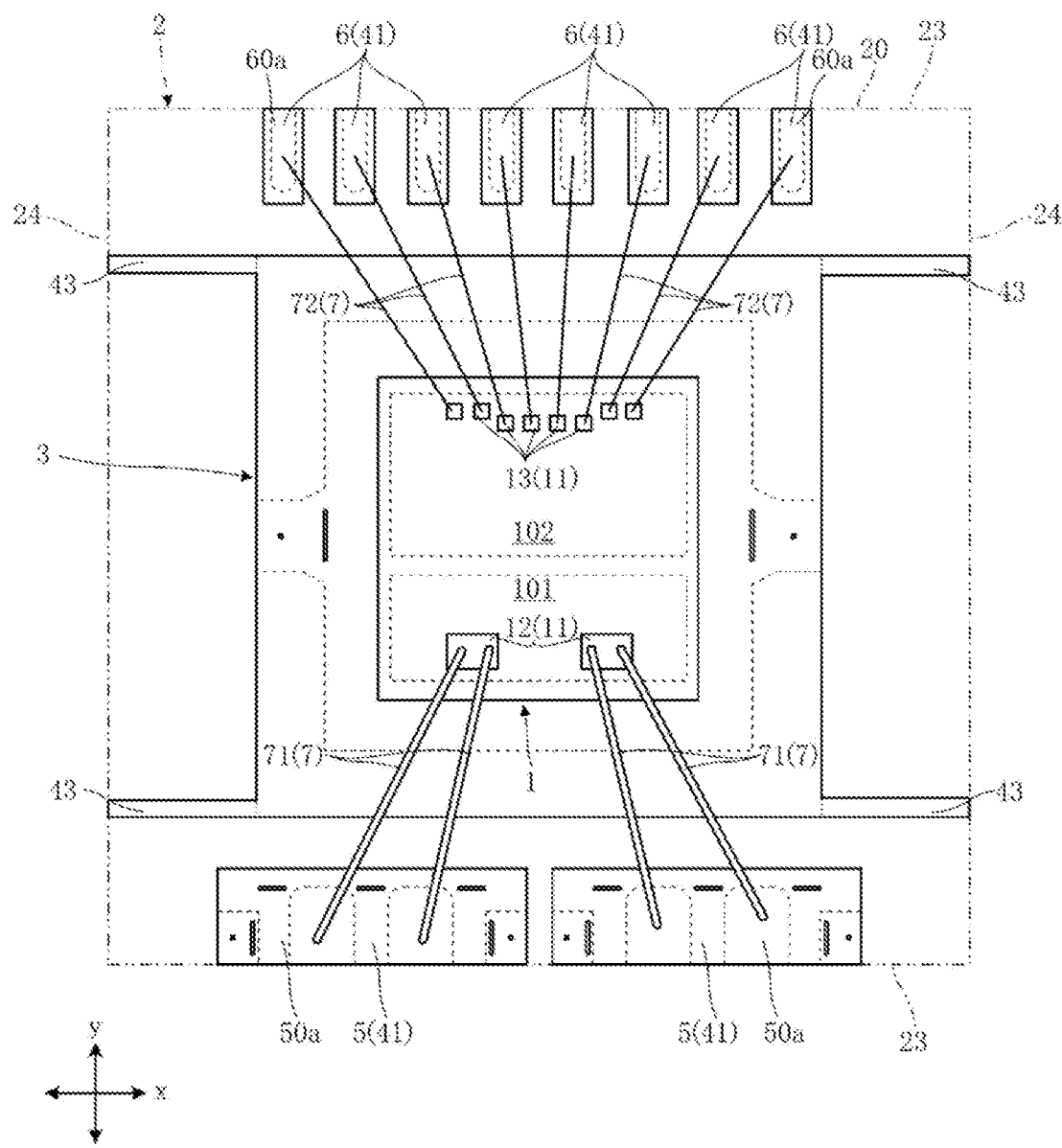
FIG. 22 is a plan view showing a semiconductor device according to another modification of the sixth embodiment of the present disclosure and is a view in which a resin member is made transparent.
Figure 23:
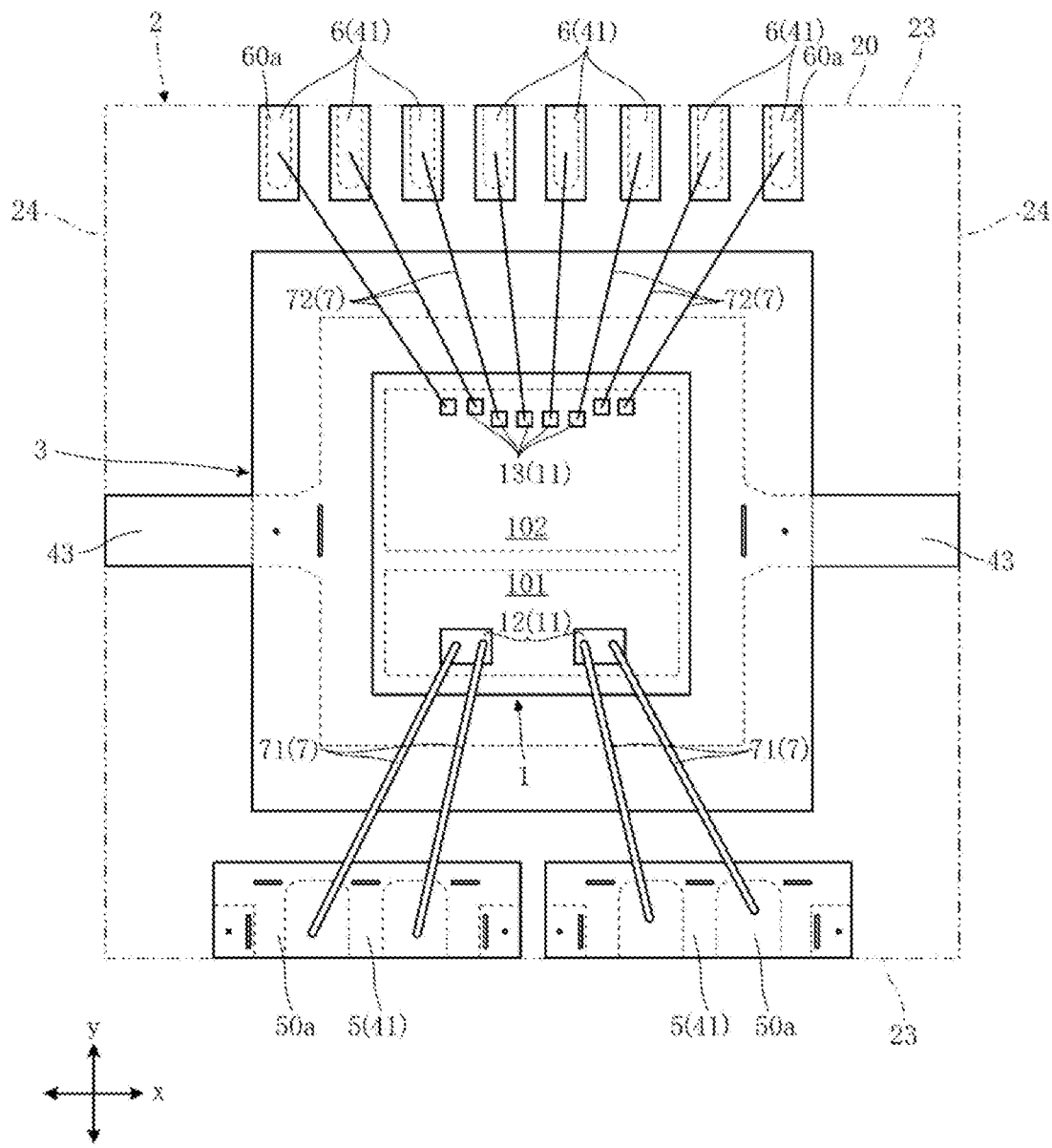
FIG. 23 is a plan view showing a semiconductor device according to another modification of the sixth embodiment of the present disclosure and is a view in which a resin member is made transparent.

The semiconductor device A6 is not limited to the example in which as shown in FIG. 20, the plurality of third leads 43 extend from four corners of the die pad 3 to four corners of the resin member 2 in the plan view. For example, the plurality of third leads 43 may be configured as shown in FIGS. 22 and 23. In the example shown in FIG. 22, the respective third leads 43 extend from the four corners of the die pad 3 along the second direction x. In the example shown in FIG. 23, the two third leads 43 extend from the third portion 33 and the fourth portion 34 of the die pad 3 in the second direction x.

Figure 24:
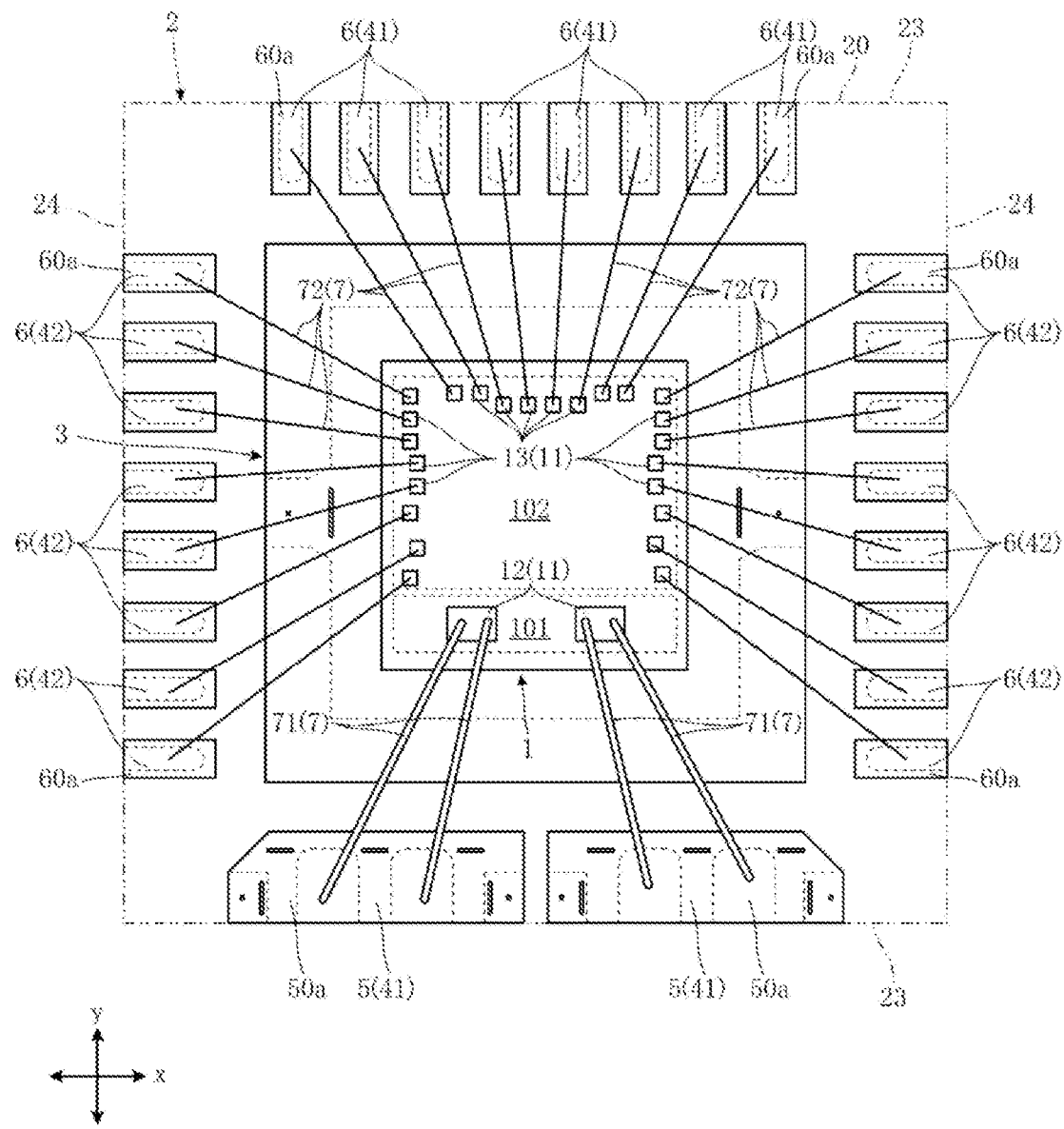
FIG. 24 is a plan view showing a semiconductor device which does not include a third lead and is a view in which a resin member is made transparent.

In the first to sixth embodiments of the present disclosure, each of the semiconductor devices A1 to A6 includes the plurality of third leads 43. Unlike this configuration, each of the semiconductor devices A1 to A6 may not include the third leads 43. For example, FIG. 24 shows an example of the semiconductor device A1 having a configuration that does not include the third leads 43. As shown in FIG. 24, the semiconductor device of the present disclosure may be configured not to include the third leads 43.

Figure 25:
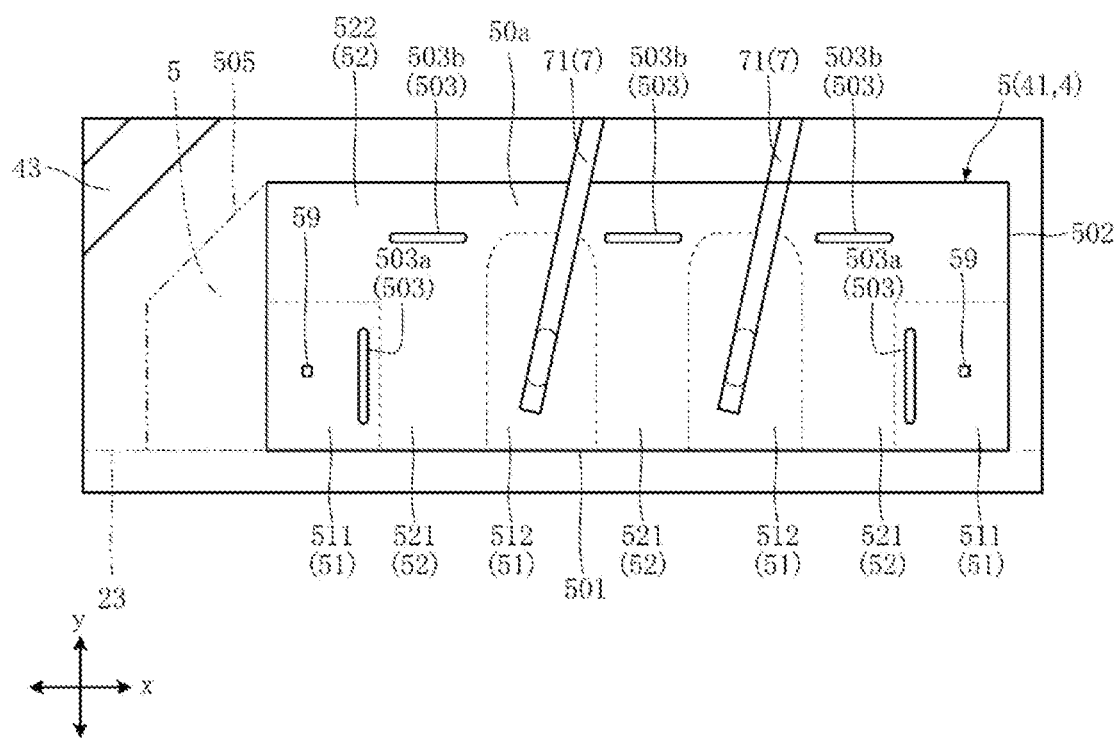
FIG. 25 is an enlarged plan view of a main part showing a first lead according to a modification of the present disclosure.

In the first to sixth embodiments of the present disclosure, there is shown the example in which the first lead 5 is formed with the notch 505. Unlike this configuration, the first lead 5 may not have the notch 505. For example, FIG. 25 shows an example in which a first lead 5 does not have a notch 505. FIG. 25 is an enlarged plan view of a main part and corresponds to FIG. 4. In FIG. 25, an outer shape of the first lead 5 having the notch 505 is indicated in an overlapping manner by an imaginary line (tow-dot chain line). In the example shown in FIG. 25, the first lead 5 has a rectangular shape in a plan view because there is no notch 505. As described above, in the first lead 5 having the rectangular shape in the plan view, the length, i.e., the dimension in the first width direction of the end edge 501, is reduced to secure an insulation distance from the adjacent third lead 43. Since the plan-view area of the first lead 5 becomes smaller, the notch 505 may be used to increase the plan-view area of the first lead 5.

In the first to sixth embodiments of the present disclosure, the arrangement and number of the third portion 33 and the fourth portion 34 of the die pad 3 are not limited to the illustrated examples and may be changed as appropriate. For example, the die pad 3 may include a plurality of third portions 33 arranged in the first direction y. Similarly, the die pad 3 may include a plurality of fourth portions 34 arranged in the first direction y. Further, in the illustrated example, each of the third portions 33 and the fourth portions 34 is connected to the central portion of each end edge 310*b* in the first direction y. However, each of the third portions 33 and the fourth portions 34 may be out of alignment to one side or the other side in the first direction y. The third portions 33 and the fourth portions 34 may be arranged such that the line segment connecting the centers of the third portions 33 and the fourth portions 34 overlaps with the semiconductor element 1 in the plan view to appropriately fix the semiconductor element 1 by clamping the die pad 3 with a clamping member. In addition, the die pad 3 may not include the third portions 33 and the fourth portions 34.

In the first to sixth embodiments of the present disclosure, there is shown the example in which the plurality of recesses 35 are formed in the die pad 3. However, a through-hole may be formed in place of each recess 35. The through-hole is configured to include each opening 302 formed in the die pad main surface 30*a*. The through-hole penetrates the die pad 3 in the thickness direction z.

Figure 26:
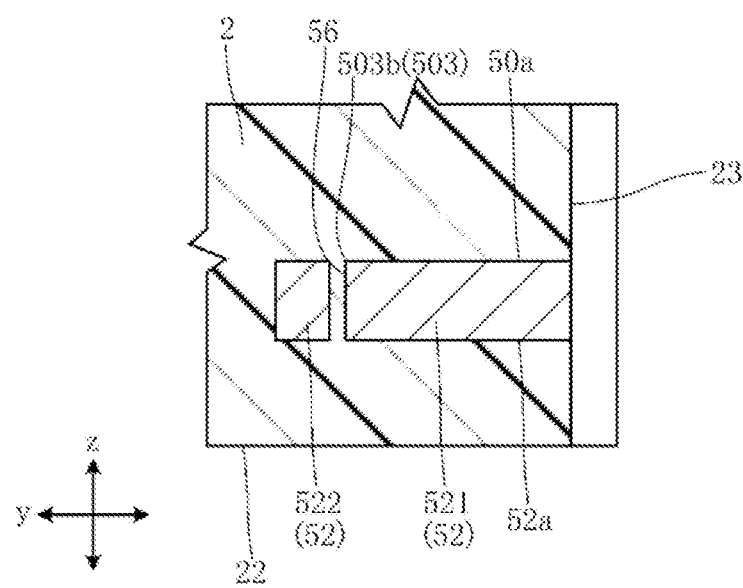
FIG. 26 is an enlarged cross-sectional view of a main part showing a first lead according to a modification of the present disclosure.

Similarly, in the first to sixth embodiments of the present disclosure, there is shown the example in which the plurality of recesses 55 are formed in the first lead 5. However, a through-hole may be formed in place of each recess 55. The through-hole is configured to include each opening 503 (the first opening 503*a* or the second opening 503*b*) formed in the first pad surface 50*a*. The through-hole penetrates the first lead 5 in the thickness direction z. For example, FIG. 26 shows an example in which a through-hole 56 including the second opening 503*b* is formed in the first lead 5. FIG. 26 is an enlarged cross-sectional view of a main part and corresponds to the cross section shown in FIG. 14. The second portion 52 is formed by half-etching from the lower surface of the first lead 5 in the thickness direction z. Therefore, when the second opening 503*b* is formed in the second portion 52 by half etching from the first pad surface 50*a*, as shown in FIG. 26, the through-hole 56 penetrating the second portion 52 is easily formed.

In the first to sixth embodiments of the present disclosure, there is shown the example in which the plurality of second openings 503*b* are arranged to indicate unsuitable regions when bonding the first connecting member 71 in each first lead 5. Contrary to this example, the plurality of second openings 503*b* may be arranged to indicate suitable regions when bonding to the first connecting member 71. For example, the plurality of second openings 503*b* may be arranged at the boundary between the inner portion 512 and the connecting portion 522, or the plurality of second openings 503*b* may be arranged at the boundary between the inner portion 512 and the connecting portion 522.

In the first to sixth embodiments, the pair of openings 302 are formed on the die pad main surface 30*a* of the die pad 3. However, the openings 302 may not be formed. Further, although the plurality of openings 503 are formed on the first pad surface 50*a* of the first lead 5, the openings 503 may not be formed.

The semiconductor device according to the present disclosure is not limited to the above-described embodiments. The specific configuration of each part of the semiconductor device of the present disclosure may be changed in design variously. For example, the semiconductor device of the present disclosure includes embodiments relating to the following supplementary notes.

[Supplementary Note 1]

A semiconductor device, including:
- a semiconductor element having an element main surface and an element back surface spaced apart from each other in a thickness direction and including a plurality of main surface electrodes arranged on the element main surface;
- a die pad on which the semiconductor element is mounted;
- a plurality of leads including at least one first lead and at least one second lead and arranged around the die pad when viewed in the thickness direction;
- a plurality of connecting members including a first connecting member and a second connecting member and configured to electrically connect the plurality of main surface electrodes and the plurality of leads; and
- a resin member configured to seal the semiconductor element, a part of the die pad, parts of the plurality of leads, and the plurality of connecting members and having a rectangular shape when viewed in the thickness direction,
- wherein each of the plurality of leads is configured to entirely overlap with the resin member when viewed in the thickness direction and arranged along an outer edge of the resin member when viewed in the thickness direction,
- wherein the at least one first lead has a first pad surface to which the first connecting member is bonded,
- wherein the at least one second lead has a second pad surface to which the second connecting member is bonded, and
- wherein the first pad surface is larger than the second pad surface when viewed in the thickness direction.

[Supplementary Note 2]

The semiconductor device of Supplementary Note 1, wherein the first pad surface has a first end edge that overlaps with the outer edge of the resin member when viewed in the thickness direction,
- wherein the second pad surface has a second end edge that overlaps with the outer edge of the resin member when viewed in the thickness direction, and
- wherein the first end edge is longer than the second end edge.

[Supplementary Note 3]
The semiconductor device of Supplementary Note 2, wherein a length of the first end edge is 3 times or more and 20 times or less larger than a length of the second end edge.

[Supplementary Note 4]
The semiconductor device of Supplementary Note 2 or 3, wherein the first pad surface has a third end edge extending from the first end edge toward the die pad while being orthogonal to the first end edge when viewed in the thickness direction,
wherein the second pad surface has a fourth end edge extending from the second end edge toward the die pad while being orthogonal to the second end edge when viewed in the thickness direction, and
wherein the third end edge and the fourth end edge have a same length.

[Supplementary Note 5]
The semiconductor device of Supplementary Note 4, wherein the first end edge is longer than the third end edge, and
wherein the second end edge is shorter than the fourth end edge.

[Supplementary Note 6]
The semiconductor device of any one of Supplementary Notes 1 to 5, wherein the resin member has a resin back surface, a pair of first resin side surfaces, and a pair of second resin side surfaces,
wherein the resin back surface faces a same direction as the element back surface in the thickness direction,
wherein the pair of first resin side surfaces are spaced apart from each other in a first direction orthogonal to the thickness direction,
wherein the pair of second resin side surfaces are spaced apart from each other in a second direction orthogonal to the thickness direction and the first direction, and
wherein each of the plurality of leads is exposed from the resin back surface.

[Supplementary Note 7]
The semiconductor device of Supplementary Note 6, wherein the plurality of leads includes a plurality of first side leads arranged such that the die pad is interposed among the plurality of first side leads in the first direction, and respectively exposed from any one of the pair of first resin side surfaces, and
wherein the plurality of first side leads includes one or more of the at least one first lead.

[Supplementary Note 8]
The semiconductor device of Supplementary Note 7, wherein the plurality of first side leads includes one or more of the at least one second lead.

[Supplementary Note 9]
The semiconductor device of Supplementary Note 7 or 8, wherein the plurality of leads includes a plurality of second side leads arranged such that the die pad is interposed among the plurality of second side leads in the second direction, and respectively exposed from any one of the pair of second resin side surfaces, and
wherein the plurality of second side leads includes one or more of the at least one second lead.

[Supplementary Note 10]
The semiconductor device of Supplementary Note 9, wherein the plurality of second side leads do not include the at least one first lead.

[Supplementary Note 11]
The semiconductor device of any one of Supplementary Notes 6 to 10, wherein the at least one first lead has a plurality of first exposed surfaces each facing a side opposite to the first pad surface in the thickness direction and exposed from the resin back surface, and
wherein the at least one second lead has a second exposed surface facing a side opposite to the second pad surface in the thickness direction and exposed from the resin back surface.

[Supplementary Note 12]
The semiconductor device of Supplementary Note 11, wherein each of the plurality of first exposed surfaces is larger than the second exposed surface when viewed in the thickness direction.

[Supplementary Note 13]
The semiconductor device of any one of Supplementary Notes 1 to 12,
wherein the semiconductor element includes a power component including a power element and a control circuit component constituting a control circuit configured to control the power element,
wherein the plurality of main surface electrodes includes a first main surface electrode electrically connected to the power component and a second main surface electrode electrically connected to the control circuit component,
wherein the first main surface electrode is electrically connected to the at least one first lead via the first connecting member, and
wherein the second main surface electrode is electrically connected to the at least one second lead via the second connecting member.

[Supplementary Note 14]
The semiconductor device of any one of Supplementary Notes 1 to 13, wherein the first connecting member is a bonding wire bonded by wedge bonding.

[Supplementary Note 15]
The semiconductor device of any one of Supplementary Notes 1 to 14, wherein the die pad has a surface arranged opposite to a surface on which the semiconductor element is mounted in the thickness direction and exposed from the resin member.

[Supplementary Note 16]
The semiconductor device of any one of Supplementary Notes 1 to 15, further comprising a plurality of third leads extending from the outer edge of the die pad toward an outer edge of the resin member when viewed in the thickness direction.

[Supplementary Note 17]
The semiconductor device of Supplementary Note 16, wherein the die pad has a rectangular shape when viewed in the thickness direction, and
wherein the plurality of third leads extends from four corners of the die pad when viewed in the thickness direction.

[Supplementary Note 18]
The semiconductor device of Supplementary Note 17, wherein the plurality of third leads extends toward four corners of the resin member when viewed in the thickness direction.

[Supplementary Note 19]
The semiconductor device of Supplementary Note 18, wherein each of the plurality of third leads has a smaller dimension along the thickness direction than the die pad, and both sides of each of the plurality of third leads in the thickness direction are covered with the resin member.

According to the present disclosure in some embodiments, it is possible to provide a semiconductor device with higher performance and higher quality.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a semiconductor element having an element main surface and an element back surface spaced apart from each other in a thickness direction and including a plurality of main surface electrodes arranged on the element main surface;
   a die pad on which the semiconductor element is mounted;
   a plurality of leads including at least one first lead and at least one second lead and arranged around the die pad when viewed in the thickness direction;
   a plurality of connecting members including a first connecting member and a second connecting member and configured to electrically connect the plurality of main surface electrodes and the plurality of leads;
   a resin member configured to seal the semiconductor element, a part of the die pad, parts of the plurality of leads, and the plurality of connecting members and having a rectangular shape when viewed in the thickness direction; and
   a plurality of third leads extending from an outer edge of the die pad toward an outer edge of the resin member when viewed in the thickness direction,
      wherein each of the plurality of leads is configured to entirely overlap with the resin member when viewed in the thickness direction and arranged along an outer edge of the resin member when viewed in the thickness direction,
      wherein the at least one first lead has a first pad surface to which the first connecting member is bonded,
      wherein the at least one second lead has a second pad surface to which the second connecting member is bonded,
      wherein the first pad surface is larger than the second pad surface when viewed in the thickness direction,
      wherein the die pad has a rectangular shape when viewed in the thickness direction,
      wherein the plurality of third leads extends from four corners of the die pad when viewed in the thickness direction,
      wherein the at least one first lead is formed with a notch that is formed along an adjacent third lead among the plurality of third leads when viewed in the thickness direction,
      wherein the first pad surface has:
         a first end edge that overlaps with the outer edge of the resin member when viewed in the thickness direction;
         a third end edge extending from the first end edge toward the die pad while being orthogonal to the first end edge when viewed in the thickness direction;
         a fifth end edge that is formed by the notch; and
         a sixth end edge that is formed between the third end edge and the fifth end edge and is parallel to the first end edge when viewed in the thickness direction,
      wherein the first end edge is longer than the third end edge, and
      wherein the sixth end edge is longer than the third end edge.

2. The semiconductor device of claim 1,
   wherein the second pad surface has a second end edge that overlaps with the outer edge of the resin member when viewed in the thickness direction, and
   wherein the first end edge is longer than the second end edge.

3. The semiconductor device of claim 2, wherein a length of the first end edge is 3 times or more and 20 times or less larger than a length of the second end edge.

4. The semiconductor device of claim 2,
   wherein the second pad surface has a fourth end edge extending from the second end edge toward the die pad while being orthogonal to the second end edge when viewed in the thickness direction, and
   wherein the third end edge and the fourth end edge have a same length.

5. The semiconductor device of claim 4,
   wherein the second end edge is shorter than the fourth end edge.

6. The semiconductor device of claim 1,
   wherein the resin member has a resin back surface, a pair of first resin side surfaces, and a pair of second resin side surfaces,
   wherein the resin back surface faces a same direction as the element back surface in the thickness direction,
   wherein the pair of first resin side surfaces are spaced apart from each other in a first direction orthogonal to the thickness direction,
   wherein the pair of second resin side surfaces are spaced apart from each other in a second direction orthogonal to the thickness direction and the first direction, and
   wherein each of the plurality of leads is exposed from the resin back surface.

7. The semiconductor device of claim 6,
   wherein the plurality of leads includes a plurality of first side leads arranged such that the die pad is interposed among the plurality of first side leads in the first direction, and respectively exposed from any one of the pair of first resin side surfaces, and
   wherein the plurality of first side leads includes one or more of the at least one first lead.

8. The semiconductor device of claim 7, wherein the plurality of first side leads includes one or more of the at least one second lead.

9. The semiconductor device of claim 7,
   wherein the plurality of leads includes a plurality of second side leads arranged such that the die pad is interposed among the plurality of second side leads in the second direction, and respectively exposed from any one of the pair of second resin side surfaces, and
   wherein the plurality of second side leads includes one or more of the at least one second lead.

10. The semiconductor device of claim 9, wherein the plurality of second side leads do not include the at least one first lead.

11. The semiconductor device of claim 7, wherein the plurality of first side leads includes two first leads on one side of the die pad in the first direction.

12. The semiconductor device of claim 11, wherein the plurality of first side leads further includes two first leads on the other side of the die pad in the first direction.

13. The semiconductor device of claim 6,
wherein the at least one first lead has a plurality of first exposed surfaces each facing a side opposite to the first pad surface in the thickness direction and exposed from the resin back surface, and
wherein the at least one second lead has a second exposed surface facing a side opposite to the second pad surface in the thickness direction and exposed from the resin back surface.

14. The semiconductor device of claim 13, wherein each of the plurality of first exposed surfaces is larger than the second exposed surface when viewed in the thickness direction.

15. The semiconductor device of claim 1,
wherein the semiconductor element includes a power component including a power element and a control circuit component constituting a control circuit configured to control the power element,
wherein the plurality of main surface electrodes includes a first main surface electrode electrically connected to the power component and a second main surface electrode electrically connected to the control circuit component,
wherein the first main surface electrode is electrically connected to the at least one first lead via the first connecting member, and
wherein the second main surface electrode is electrically connected to the at least one second lead via the second connecting member.

16. The semiconductor device of claim 1, wherein the die pad has a surface arranged opposite to a surface on which the semiconductor element is mounted in the thickness direction and exposed from the resin member.

17. The semiconductor device of claim 1, wherein the plurality of third leads extends toward four corners of the resin member when viewed in the thickness direction.

18. The semiconductor device of claim 17, wherein each of the plurality of third leads has a smaller dimension along the thickness direction than the die pad, and both sides of each of the plurality of third leads in the thickness direction are covered with the resin member.

19. The semiconductor device of claim 1, wherein the at least one first lead includes a pair of clamp marks recessed in the thickness direction from the first pad surface.

20. The semiconductor device of claim 19, wherein the at least one first lead includes a pair of outer portions, and the pair of clamp marks are formed on the pair of outer portions, respectively.

* * * * *